(12) United States Patent
Daeche et al.

(10) Patent No.: US 8,686,569 B2
(45) Date of Patent: Apr. 1, 2014

(54) DIE ARRANGEMENT AND METHOD OF FORMING A DIE ARRANGEMENT

(75) Inventors: Frank Daeche, Unterhaching (DE); Joachim Mahler, Regensburg (DE); Anton Prueckl, Schierling (DE); Stefan Landau, Wehrheim (DE); Josef Hoeglauer, Heimstetten (DE)

(73) Assignee: Infineon Technologies AG, Neubiberg (DE)

( * ) Notice: Subject to any disclaimer, the term of this patent is extended or adjusted under 35 U.S.C. 154(b) by 394 days.

(21) Appl. No.: 12/967,281

(22) Filed: Dec. 14, 2010

(65) Prior Publication Data

US 2012/0146201 A1    Jun. 14, 2012

(51) Int. Cl.
| | |
|---|---|
| H01L 23/48 | (2006.01) |
| H01L 23/52 | (2006.01) |
| H01L 29/40 | (2006.01) |
| H01L 23/495 | (2006.01) |
| H01L 23/02 | (2006.01) |
| H01L 23/04 | (2006.01) |

(52) U.S. Cl.
USPC ........... 257/777; 257/676; 257/686; 257/699; 257/E23.067

(58) Field of Classification Search
USPC ......................................................... 257/699
See application file for complete search history.

(56) References Cited

U.S. PATENT DOCUMENTS

| | | | |
|---|---|---|---|
| 5,034,350 A | 7/1991 | Marchisi | |
| 5,219,795 A | 6/1993 | Kumai et al. | |
| 5,811,879 A * | 9/1998 | Akram | 257/723 |
| 7,030,317 B1 * | 4/2006 | Oman | 174/541 |
| 2006/0113643 A1 * | 6/2006 | Loo et al. | 257/666 |
| 2007/0284720 A1 | 12/2007 | Otremba et al. | |
| 2009/0189291 A1 | 7/2009 | Landau et al. | |

FOREIGN PATENT DOCUMENTS

| | | |
|---|---|---|
| DE | 102006021959 B4 | 11/2007 |
| DE | 102007039916 A1 | 2/2009 |
| DE | 102009005650 A1 | 8/2009 |

OTHER PUBLICATIONS

English Abstract of DE 102007039916 dated Jun. 26, 2013.

* cited by examiner

Primary Examiner — Daniel Luke

(57) ABSTRACT

A die arrangement includes a carrier having a first side and a second side opposite the first side, the carrier including an opening leading from the first side of the carrier to the second side of the carrier; a first die disposed over the first side of the carrier and electrically contacting the carrier; a second die disposed over the second side of the carrier and electrically contacting the carrier; and an electrical contact structure leading through the opening in the carrier and electrically contacting the second die.

15 Claims, 12 Drawing Sheets

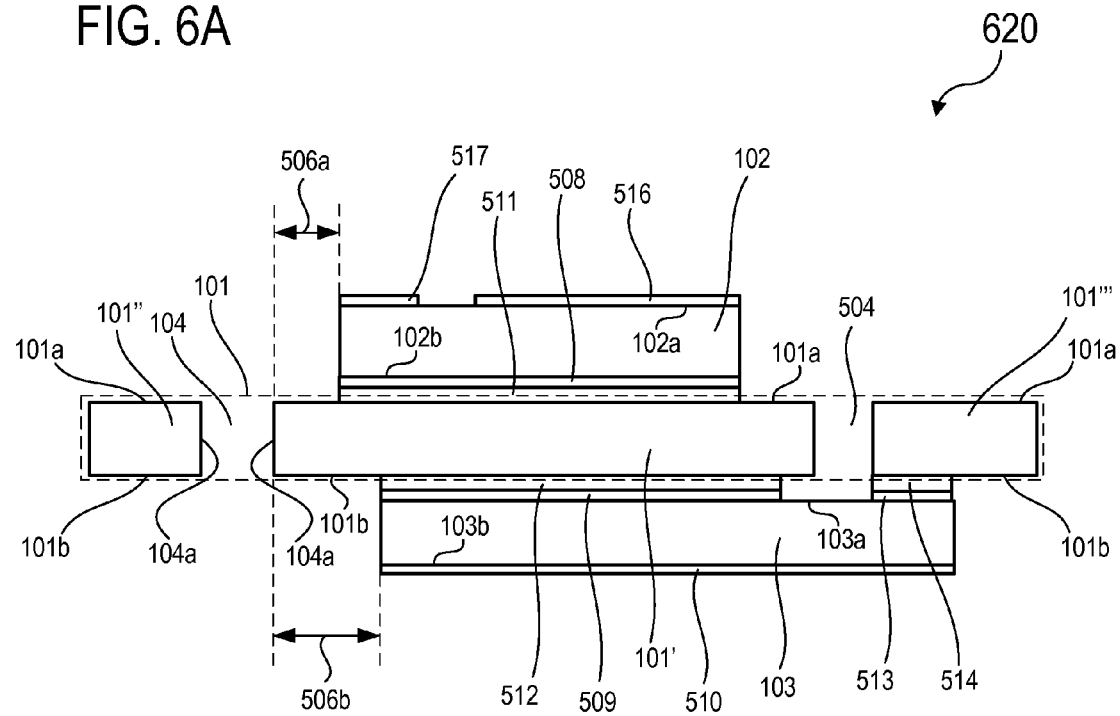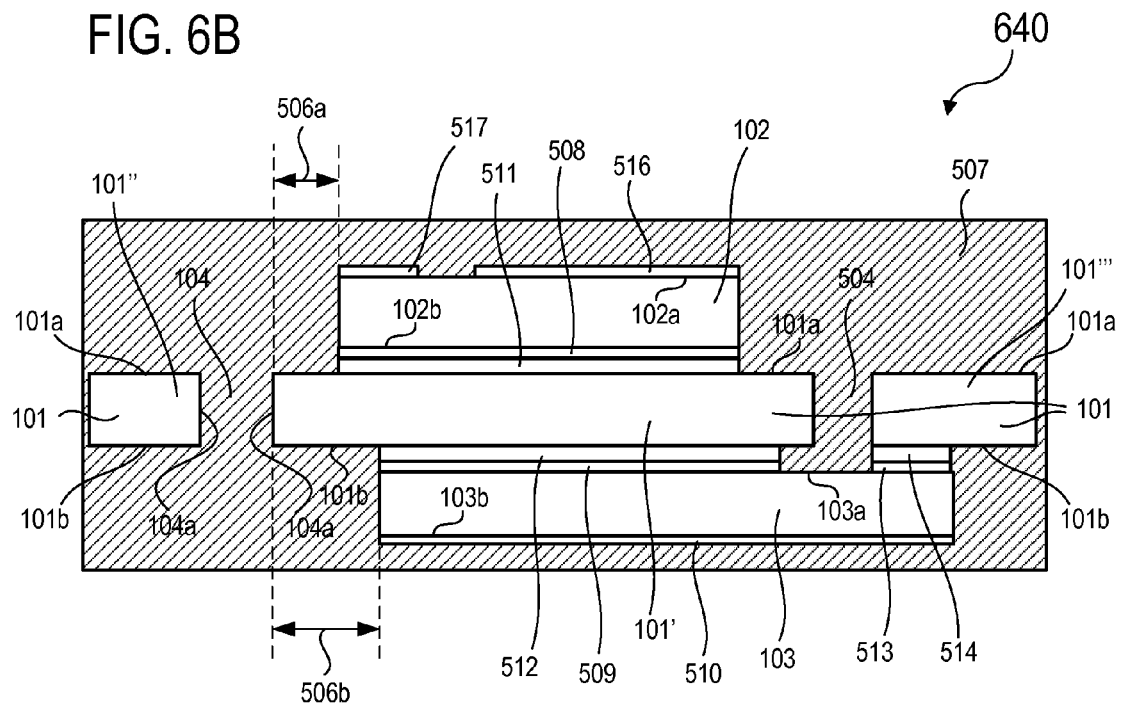

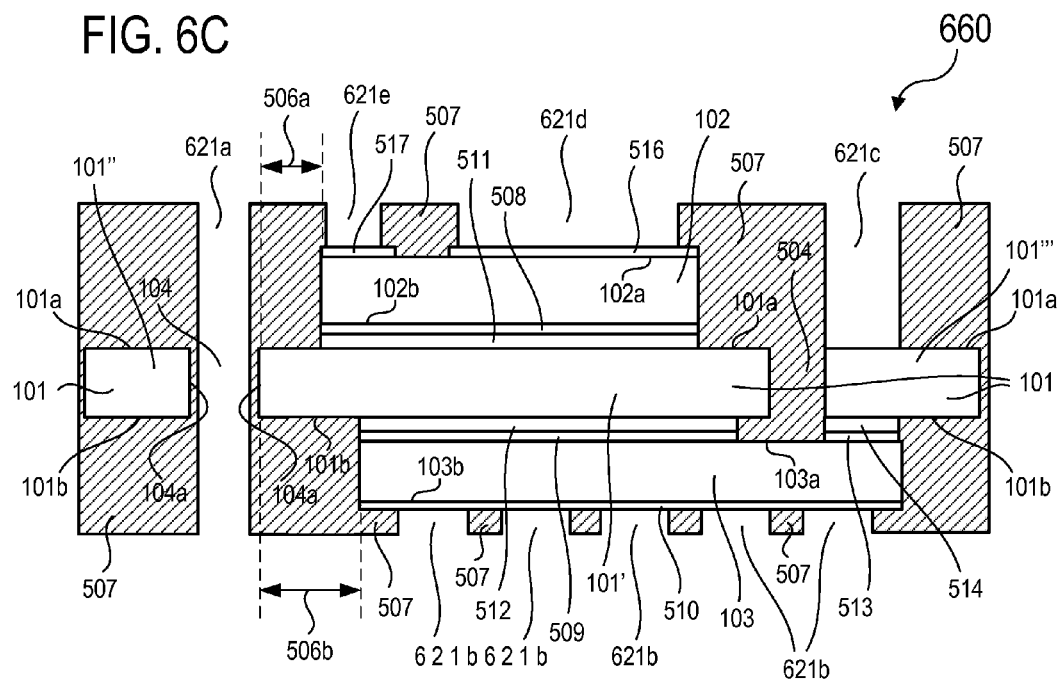
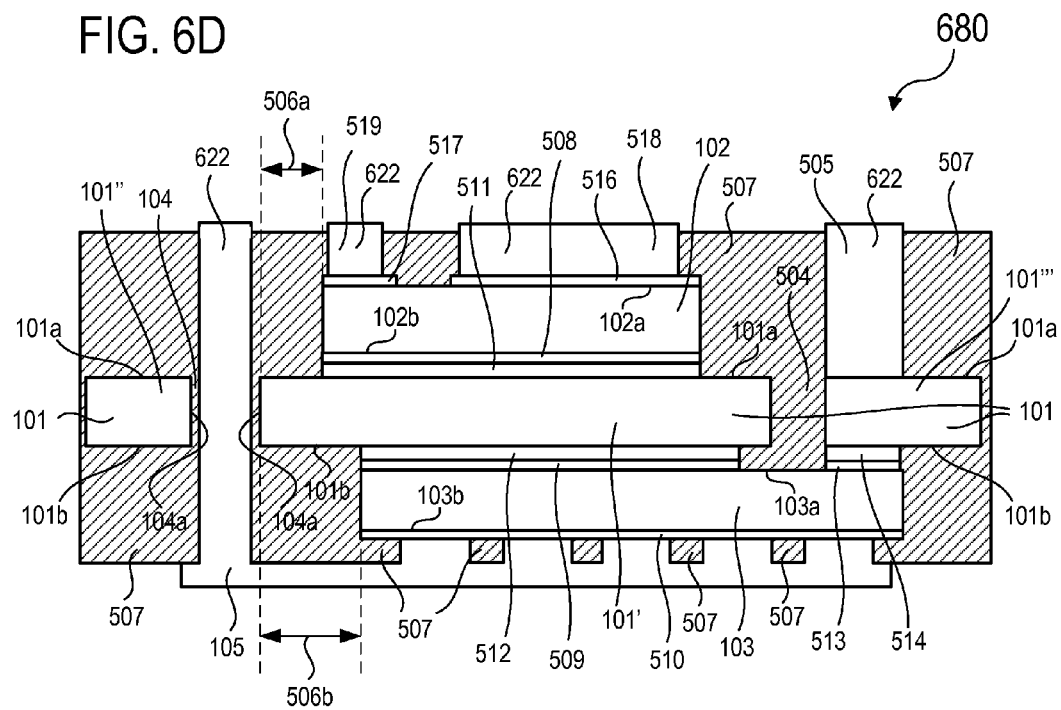

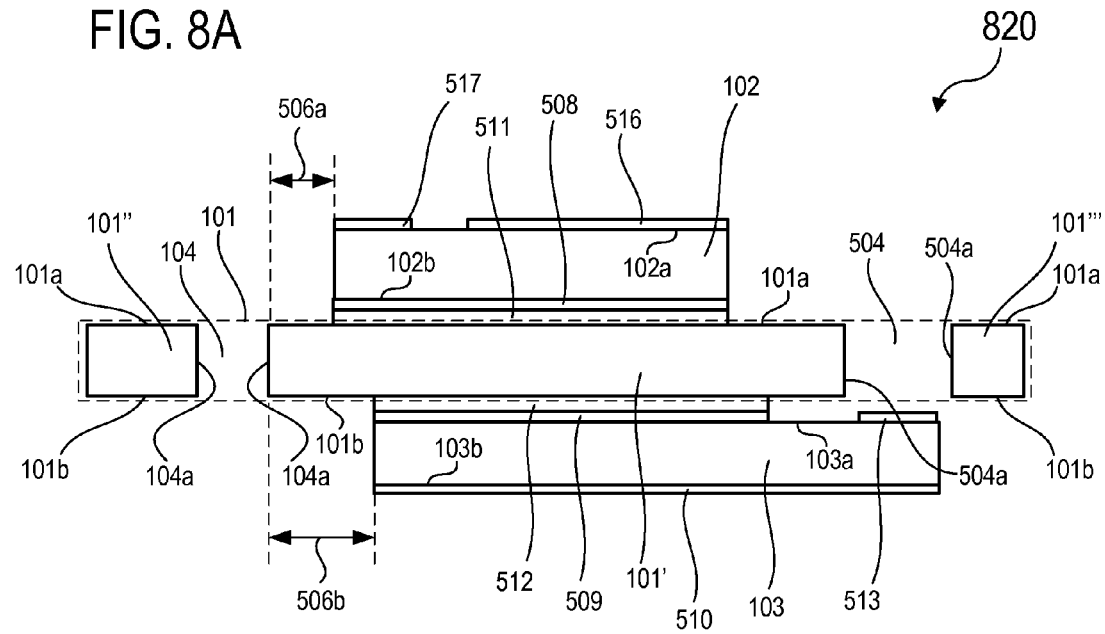
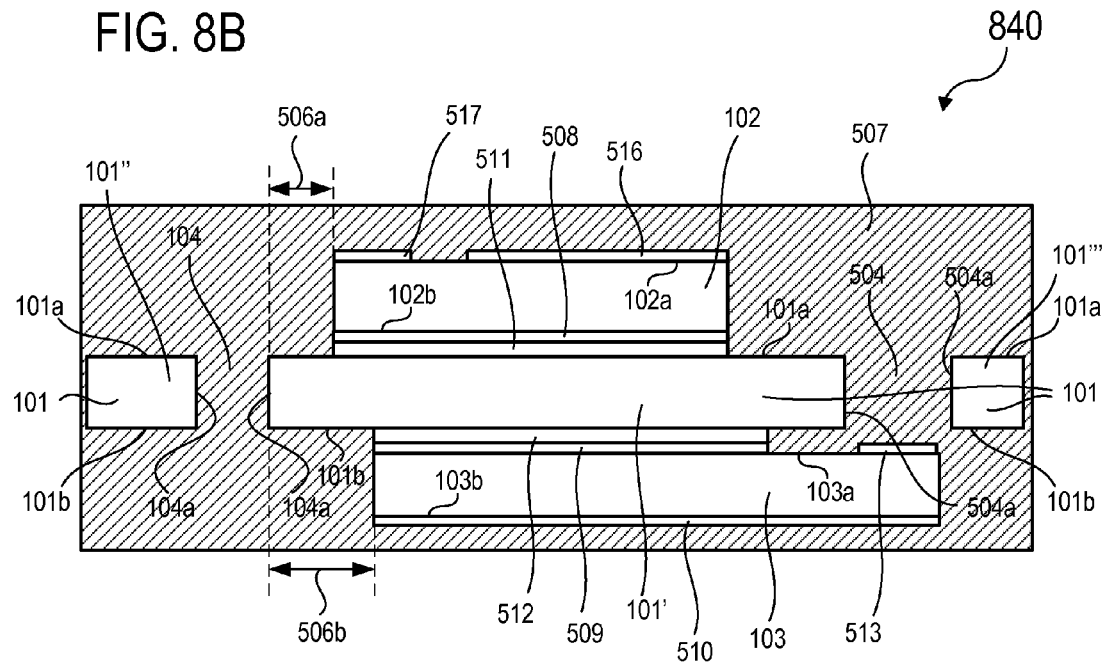

DIE ARRANGEMENT AND METHOD OF FORMING A DIE ARRANGEMENT

TECHNICAL FIELD

Embodiments generally relate to a die arrangement and a method of forming a die arrangement.

BACKGROUND

In so-called multi-chip packages, more than one, e.g. several chips may be arranged within a single package. The chips may be electrically connected with one another and/or the periphery by means of electrical connections or contact structures. In this context, it may be desirable to have an efficient and/or space-saving electrical connection scheme.

BRIEF DESCRIPTION OF THE DRAWINGS

In the drawings, like reference characters generally refer to the same parts throughout the different views. The drawings are not necessarily to scale, emphasis instead generally being placed upon illustrating the principles of embodiments. In the following description, various embodiments are described with reference to the following drawings, in which:

FIGS. 6A to 6D show schematic cross-sectional views for illustrating different process stages in a method of forming the die arrangement of FIG. 5 in accordance with an embodiment;

FIGS. 8A to 8D show schematic cross-sectional views for illustrating different process stages in a method of forming the die arrangement of FIG. 7 in accordance with an embodiment;

The term "layer" or "layer structure" as used herein may be understood to refer to a single layer, or to a layer sequence (also referred to as layer stack) including a plurality of sublayers. In a layer sequence or layer stack the individual sublayers may, for example, include or may be made of different materials, or at least one of the sublayers may include or may be made of the same material as another one of the sublayers.

The terms "disposed on", "arranged on" or "formed on" as used herein may be understood to refer to a layer (or some other element or entity) that may be located in direct mechanical and/or electrical contact on another layer (element or entity). A layer (element or entity) may also be located in indirect (mechanical and/or electrical) contact with another layer (element or entity), in this case one or more additional layers (elements or entities) may be present in-between.

The terms "disposed over", "arranged over" or "formed over" as used herein may be understood to refer to a layer (or some other element or entity) that may be located at least indirectly on another layer (element or entity). That is, one or more other layers (elements or entities) may be located between the given layers (elements or entities).

The terms "electrically connected", "electrically contacted" or "electrically coupled" may be understood to include both a direct electrical connection, contact or coupling and an indirect electrical connection, contact or coupling.

Figure 1:
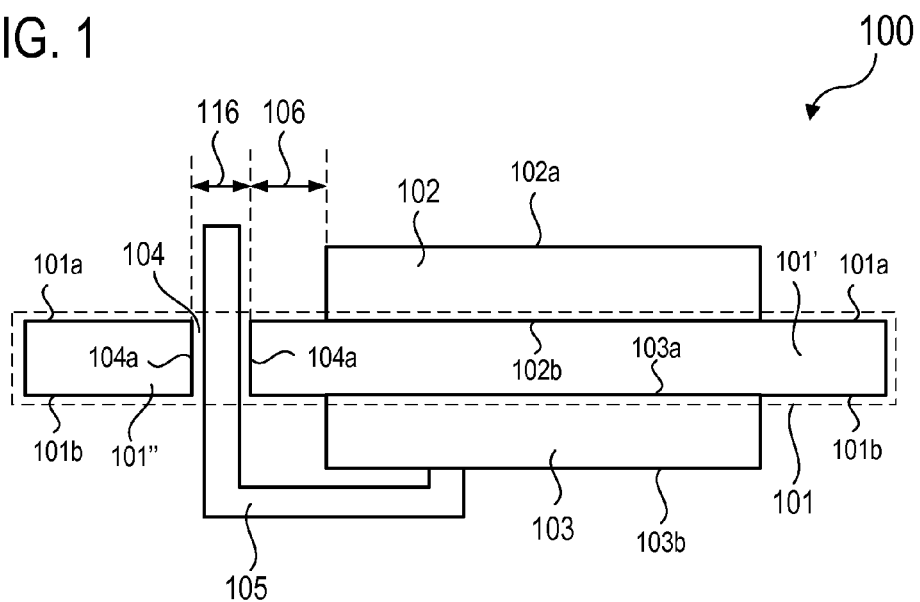
FIG. 1 shows a schematic cross-sectional view of a die arrangement in accordance with an embodiment.

FIG. 1 shows a schematic cross-sectional view of a die arrangement 100 in accordance with an embodiment. The die arrangement 100 may include a carrier 101 having a first side 101a and a second side 101b opposite the first side 101a. the carrier 101 may include an opening 104 leading from the first side 101a of the carrier 101 to the second side 101b of the carrier 101. The die arrangement 100 may further include a first die 102 disposed over the first side 101a of the carrier 101 and electrically contacting the carrier 101. The die arrangement 100 may further include a second die 103 disposed over the second side 101b of the carrier 101 and electrically contacting the carrier 101. The die arrangement 100 may further include an electrical contact structure 105 leading through the opening 104 in the carrier 101 and electrically contacting the second die 103.

The carrier 101 may include a first region 101' and a second region 101". The opening 104 may be formed between the first region 101' and the second region 101", as shown.

The first region 101' of the carrier 101 may correspond to a region of the carrier 101, over which at least a part of the first die 102 and the second die 103 may be disposed, as shown. For example, the first region 101' of the carrier 101 may correspond to a region of the carrier 101 that may be electrically contacted by an electrical contact of the first die 102 located on a second side 102b of the first die 102, as will be described below. Furthermore, the first region 101' of the carrier 101 may, for example, correspond to a region of the carrier 101 that may be electrically contacted by a first electrical contact of the second die 103 located on a first side 103a of the second die 103 or by a second electrical contact of the second die 103 located on a second side 103b of the second die 103 opposite the first side 103a, as will be described below.

In accordance with some embodiments, the second region 101" of the carrier 101 may be electrically insulated from the first region 101' of the carrier 101.

In accordance with an embodiment, the carrier 101 may be configured as a chip carrier or circuit carrier.

In accordance with some embodiments, the carrier 101 may include or may be made of an electrically conductive material, such as for example metal.

A carrier that is made of metal may also be referred to as a metal carrier or metallic carrier.

In accordance with an embodiment, the electrically conductive material may include or may be at least one of the following materials: copper (Cu), aluminum (Al), silver (Ag), nickel (Ni). In accordance with other embodiments, the electrically conductive material may include or may be other materials.

In accordance with an embodiment, the carrier 101 may be configured as a metal strip, for example as a thin metal strip in accordance with an embodiment, for example having a thickness in the range from about 30 µm to about 3 µmm in accordance with an embodiment, for example in the range from about 30 µm to about 100 µm in accordance with an embodiment, or for example in the range from about 150 µm to about 250 µm in accordance with another embodiment, or for example in the range from about 1 mm to about 3 mm in accordance with another embodiment.

In accordance with some embodiments, the carrier 101 may be configured as a lead frame, for example as a metal lead frame in accordance with an embodiment, e.g. as a copper lead frame in accordance with an embodiment or as an aluminum lead frame in accordance with another embodiment.

In accordance with an embodiment, the first side 101a of the carrier 101 may be an upper side of the carrier 101 and the second side 101b of the carrier 101 may be a lower side of the carrier 101, as shown in FIG. 1.

In accordance with some embodiments, the first die 102 and the second die 103 may be electrically connected with one another via the first region 101' of the carrier 101. Thus, in accordance with some embodiments, the die arrangement 100 may be configured such that electrical current may flow from the first die 102 towards the second die 103 (or vice versa) via the first region 101' of the carrier 101.

The carrier 101 may include an opening 104, as shown. The opening 104 may be located between the first region 101' of the carrier 101 and the second region 101" of the carrier 101, as shown. In accordance with an embodiment, the opening 104 may be laterally spaced apart from at least one of the first die 102 and the second die 103, as shown in FIG. 1.

In accordance with an embodiment, the opening 104 may be located laterally proximate (in other words, close to or near) at least one of the first die 102 and the second die 103. For example, a lateral distance (indicated by double arrow 106 in FIG. 1) between the opening 104 and at least one of the first die 102 and the second die 103 may be in the range from about 10 µm to about 400 µm in accordance with an embodiment, for example in the range from about 10 µm to about 50 µm in accordance with an embodiment, or for example in the range from about 100 µm to about 250 µm in accordance with another embodiment, or for example in the range from about 250 µm to about 400 µm in accordance with another embodiment.

In accordance with an embodiment, the lateral distance 106 between the opening 104 and the first die 102 or second 103 may be the same for the first die 102 and the second die 103, as shown. In accordance with another embodiment, the lateral distance 106 may be different for the first die 102 and the second die 103 (not shown in FIG. 1, see e.g. FIG. 5). For example, in accordance with an embodiment, the lateral distance between the opening 104 and the first die 102 may be smaller than the lateral distance between the opening 104 and the second die 103. In accordance with another embodiment, the lateral distance 106 between the opening 104 and the second die 103 may be smaller than the lateral distance between the opening 104 and the first die 102.

In accordance with some embodiments, the electrical contact structure 105 may be electrically insulated from at least the first region 101' of the carrier 101. In accordance with an embodiment, the electrical contact structure 105 may be electrically insulated from the first region 101' and the second region 101" of the carrier 101. In accordance with an embodiment, the electrical contact structure 105 may be electrically insulated from the entire carrier 101. In accordance with an embodiment, the electrical contact structure 105 may be electrically insulated from the carrier 101 by means of one or more electrically insulating layers disposed between the electrical contact structure 105 and the carrier 101 (not shown, see e.g. FIG. 5).

In accordance with some embodiments, the opening 104 may include a side wall (or side walls) 104a that may illustratively be formed by the carrier 101 (e.g. by the first region 101' and the second region 101" of the carrier 101), as shown in FIG. 1.

Figure 5:
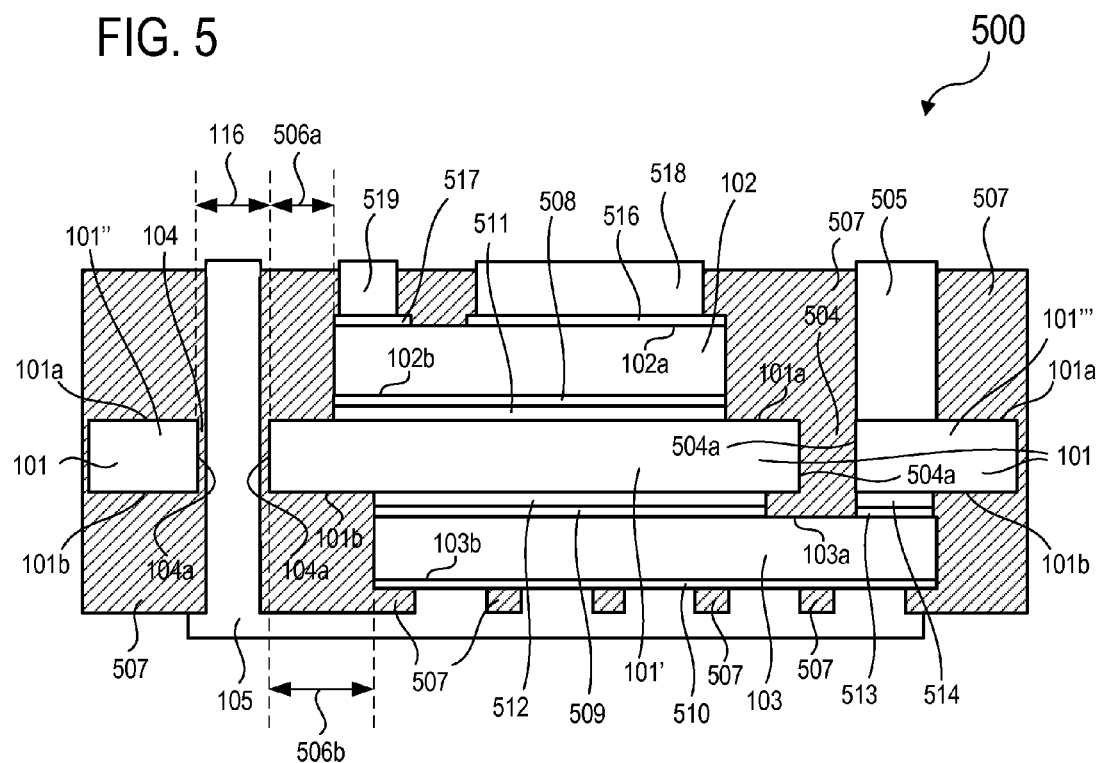
FIG. 5 shows a schematic cross-sectional view of a die arrangement in accordance with an embodiment.

In accordance with an embodiment, an electrically insulating layer may be disposed over the side wall (or side walls) 104a of the opening 104 (not shown, see e.g. FIG. 5). In accordance with an embodiment, the electrical insulating layer may be disposed at least between the side wall (or side walls) 104a of the opening 104 and a portion of the electrical contact structure 105 that is located within the opening 104. In accordance with an embodiment, the electrically insulating layer may electrically insulate the electrical contact structure 105 from at least the first region 101' of the carrier 101. Illustratively, a side wall (or side walls) 104a of the opening 104 may be clad with electrically insulating material in accordance with some embodiments.

In accordance with another embodiment, the electrical contact structure 105 may be spaced apart from the side wall (or side walls) 104a such that a gap (or gaps) may be formed in the opening 104 between the electrical contact structure 105 and the side wall (or side walls) 104a. The gap(s) may serve as electrical insulation of the electrical contact structure 105.

In accordance with an embodiment, the opening 104 may be formed in the carrier 101 using at least one of the following processes: an etch process, a laser ablation process, a die-cutting process, a punching process. In accordance with other embodiments, other processes that may be suitable to form openings or holes in a carrier (for example, in a metal carrier such as e.g. a thin metal strip, e.g. a lead frame) may be used.

A lateral cross-section of the opening 104 may have an arbitrary shape, for example a circular shape, an elliptical shape, a rectangular shape, a quadratic shape, or a polygonal shape in accordance with some embodiments, or any other shape in accordance with other embodiments.

In accordance with some embodiments, the lateral cross-section of the opening 104 may have an area that may be sufficient to accommodate at least the electrical contact structure 105 and, possibly, an electrically insulating layer disposed between the electrical contact structure and the side wall (or side walls) 104a of the opening 104. In accordance with some embodiments, the lateral cross-section 116 may have an area that may be sufficient to accommodate additional electrical contact structures and, possibly, additional electrically insulating layers for electrically insulating the electrical contact structures from one another and/or from the side wall (or side walls) 104a of the opening 104.

In accordance with an embodiment, the lateral cross-section of the opening 104 may have a diameter (indicated by double arrow 116 in FIG. 1) in the range from about 20 µm to about 400 µm, for example in the range from about 20 µm to about 100 µm in accordance with an embodiment, or for example in the range from about 150 µm to about 400 µm in accordance with another embodiment. In accordance with other embodiments, the diameter 116 of the lateral cross-section may have a different value. It has to be noted that, as mentioned above, the lateral cross-section of the opening 104 may have an arbitrary shape. In particular, the lateral cross-section may not need to have a circular shape. For example, in accordance with one embodiment, the lateral cross-section may have a rectangular shape, or an elliptical shape in accordance with another embodiment. In case that the lateral cross-section of the opening 104 has a non-circular shape (e.g. rectangular shape or elliptical shape), the above-given values for the diameter ranges may be understood to be applicable to one or more characteristic geometric dimensions of that shape. For example, in case that the lateral cross-section of the opening 104 has a rectangular shape, in other words the shape of a rectangle, the rectangle's length and/or width may have a value in the range as described above for the diameter, in accordance with an embodiment. Similarly, in case that the lateral cross-section of the opening 104 has an elliptical shape, in other words the shape of an ellipse, the ellipse's major diameter (also referred to as major axis or transverse diameter) and/or minor diameter (also referred to as minor axis or conjugate diameter) may have a value in the range as described above for the diameter, in accordance with an embodiment. Similar considerations may apply for other cross-sectional shapes of the opening 104.

In accordance with an embodiment, the electrical contact structure 105 may include or may be made of electrically conductive material such as, for example, metal. In accordance with an embodiment, the electrically conductive material may include or may be copper (Cu), aluminum (Al), nickel (Ni), silver (Ag), tin (Sn), gold (Au). In accordance with other embodiments, other electrically conductive materials may be used.

In accordance with an embodiment, the electrically conductive material of the electrical contact structure 105 may fill the opening 104. In this case, the electrical contact structure 105 may be electrically insulated from the side wall (or side walls) 104a of the carrier 101 by means of an electrically insulating layer disposed between the electrically conductive material of the electrical contact structure 105 and the side wall (or side walls) 104a of the opening 104.

In accordance with an embodiment, forming the electrical contact structure 105 may include forming an electrically insulating layer that covers the carrier 101, forming a contact hole (via) in the electrically insulating layer that leads through the opening 104 (where the side wall (or side walls) 104a of the opening 104 may remain covered with electrically insulating material) and filling the via with electrically conductive material. In accordance with other embodiments, forming the electrical contact structure 105 may include or may be achieved using other processes or process sequences.

In accordance with an embodiment, the die arrangement 100 may include one or more additional electrical contact structures (that is, in addition to the electrical contact structure 105) that may lead through the opening 104. In case that more than one electrical contact structure lead through the opening 104, the individual electrical contact structures may be electrically insulated from one another and/or from the side wall (or side walls) 104a of the opening 104, e.g. by means of one or more electrically insulating layers disposed between the electrical contact structures, in accordance with an embodiment, or by gaps disposed between adjacent electrical contact structures and/or between electrical contact structures and the side wall (or side walls) 104a of the opening 104.

In case that more than one electrical contact structure lead through the opening 104, all of the electrical contact structures may electrically contact the second die 103, in accordance with an embodiment. For example, in accordance with an embodiment, the electrical contact structures may electrically contact various (different) electrical contacts of the second die 103. In accordance with another embodiment, two or more (e.g., three, four, . . . , all) of the electrical contact structures may electrically contact the same electrical contact of the second die 103.

Alternatively, in case that more than one electrical contact structure lead through the opening, at least one of the electrical contact structures may electrically contact a die (or dies) other than the second die 103, where the other die (or dies) may be disposed over the second side 101b of the carrier 101. In accordance with an embodiment, the at least one other die may be disposed over the second side 101b of the carrier 101 in a region of the carrier 101 that may be electrically insulated from the first region 101' of the carrier 101. For example, in accordance with an embodiment, the at least one other die may be disposed over the second side 101b of the carrier 101 in the second region 101" of the carrier 101, alternatively in another region of the carrier 101.

In accordance with an embodiment, the first die 102 may have a first side 102a and a second side 102b opposite the first side 102a, as shown. In accordance with an embodiment, the second die 103 may have a first side 103a and a second side 103b opposite the first side 103a, as shown.

In accordance with an embodiment, the first side 102a of the first die 102 may be a front side of the first die 102 and the second side 102b of the first die 102 may be a back side of the first die 102. In accordance with an embodiment, the first side 103a of the second die 103 may be a front side of the second die 103 and the second side 103b of the second die 103 may be a back side of the second die 103.

In accordance with an embodiment, the first die 102 may be disposed over the first side (e.g. upper side) 101a of the carrier 101 in such a manner that the second side (e.g. back side) 102b of the first die 102 faces the first side 101a of the carrier 101, and the second die 103 may be disposed over the second side 101b (e.g. lower side) of the carrier 101 in such a manner that the first side (e.g. front side) 103a of the second die 103 faces the second side 101b of the carrier 101, as shown.

Figure 13:
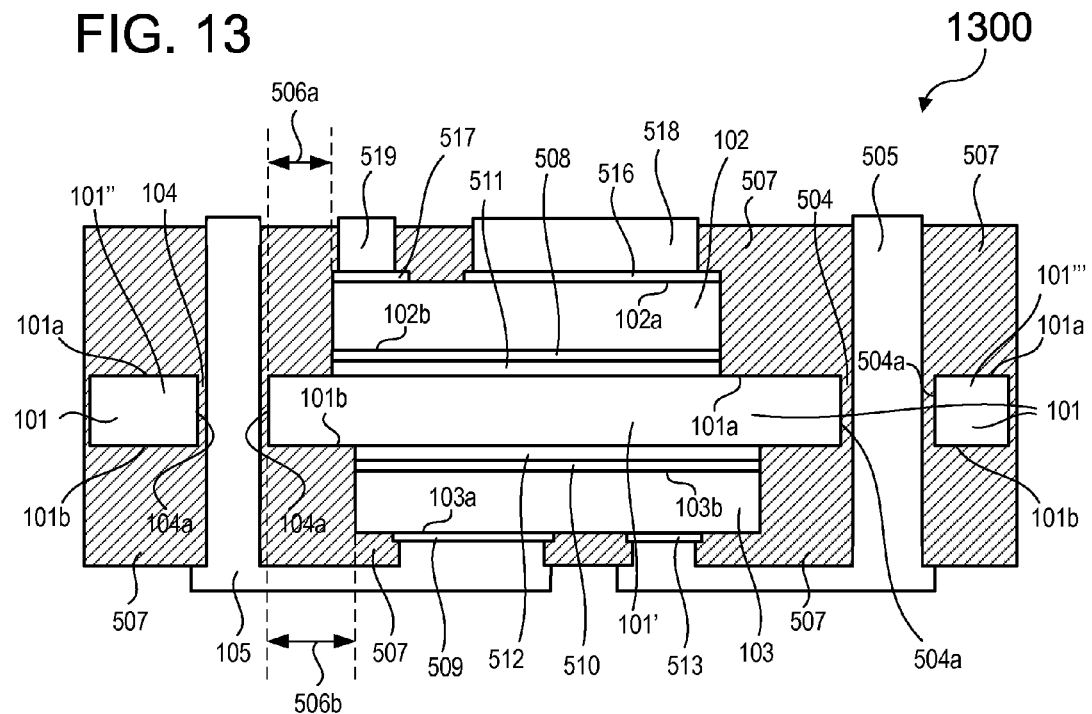
FIG. 13 shows a schematic cross-sectional view of a die arrangement in accordance with an embodiment.

In accordance with another embodiment, the first die 102 may be disposed over the first side (e.g. upper side) 101a of the carrier 101 in such a manner that the second side (e.g. back side) 102b of the first die 102 faces the first side 101a of the carrier 101, and the second die 103 may be disposed over the second side (e.g. lower side) 101b of the carrier 101 in such a manner that the second side (e.g. back side) 103b of the second die 103 faces the second side 101b of the carrier 101 (not shown in FIG. 1, see e.g. FIG. 13).

In accordance with an embodiment, the electrical contact structure 105 may electrically contact that side of the second die 103 that faces away from the second side 101b (e.g. lower side) of the carrier 101, for example the second side (e.g. back side) 103b of the second die 103 as shown in FIG. 1 (alternatively, the first side (e.g. front side) 103a of the second die 103, see e.g. FIG. 13).

In accordance with an embodiment, the first die 102 may include at least one electrical contact (e.g. pad or metallization) located on the first side (e.g. front side) 102a of the first die 102 and/or at least one electrical contact (e.g. pad or metallization) located on the second side (e.g. back side) 102b of the first die 102 (not shown in FIG. 1, see e.g. FIG. 5).

In accordance with an embodiment, the second die 103 may include at least one electrical contact (e.g. pad or metallization) located on the first side (e.g. front side) 103a of the second die 103 and/or at least one electrical contact (e.g. pad or metallization) located on the second side (e.g. back side) 103b of the second die 103 (not shown in FIG. 1, see e.g. FIG. 5).

In accordance with an embodiment, the first die 102 may include an electrical contact that may be located on the second side (e.g. back side) 102b of the first die 102, and the second die 103 may include a first electrical contact that may be located on the first side (e.g. front side) 103a of the second die 103 and a second electrical contact that may be located on the second side (e.g. back side) 103b of the second die 103 (not shown in FIG. 1, see e.g. FIG. 5).

In accordance with an embodiment, the first die 102 may be disposed over the first side (e.g. upper side) 101a of the carrier 101 in such a manner that the electrical contact of the first die 102 located on the second side (e.g. back side) 102b of the first die 102 electrically contacts the first region 101' of the carrier 101, and the second die 103 may be disposed over the second side (e.g. lower side) 101b of the carrier 101 in such a manner that the first electrical contact of the second die 103 located on the first side (e.g. front side) 103a of the second die 103 electrically contacts the first region 101' of the carrier 101 and the second electrical contact of the second die 103 located on the second side (e.g. back side) 103b of the second die 103 is electrically contacted by the electrical contact structure 105.

In accordance with an embodiment, the first die 102's electrical contact located on the second side (e.g. back side) 102b of the first die 102 may be electrically connected with the second die 103's first electrical contact located on the first side (e.g. front side) 103a of the second die 103 via the first region 101' of the carrier 101 disposed in-between.

Illustratively, in accordance with an embodiment, a back side electrical contact (e.g. pad or metallization) and a front side electrical contact (e.g pad or metallization) of two dies 102, 103 located on opposite sides 101a, 101b of a carrier 101 may be electrically connected with one another via the carrier 101, while a back side electrical contact (e.g. pad or metallization) of one die 103 of the two dies 102, 103 may be electrically contacted by an electrical contact structure 105 leading through an opening 104 in the carrier 101.

In accordance with another embodiment, the first die 102 may be disposed over the first side (e.g. upper side) 101a of the carrier 101 in such a manner that the electrical contact of the first die 102 located on the second side (e.g. back side) 102b of the first die 102 electrically contacts the first region 101' of the carrier 101, and the second die 103 may be disposed over the second side (e.g. lower side) 101b of the carrier 101 in such a manner that the second electrical contact of the second die 103 located on the second side (e.g. back side) 103b of the second die 103 electrically contacts the first region 101' of the carrier 101 and the first electrical contact of the second die 103 located on the first side (e.g. front side) 103a of the second die 103 is electrically contacted by the electrical contact structure 105 (not shown in FIG. 1, see e.g. FIG. 13).

In accordance with an embodiment, the first die 102's electrical contact located on the second side (e.g. back side) 102b of the first die 102 may be electrically connected with the second die 103's second electrical contact located on the second side (e.g. back side) 103b of the second die 103 via the first region 101' of the carrier 101 disposed in-between.

Illustratively, in accordance with an embodiment, back side electrical contacts (e.g. pads or metallizations) of two dies 102, 103 located on opposite sides 101a, 101b of a carrier 101 may be electrically connected with one another via the carrier 101, while a front side electrical contact (e.g. pad or metallization) of one die 103 of the two dies 102, 103 may be electrically contacted by an electrical contact structure 105 leading through an opening 104 in the carrier 101.

In accordance with an embodiment, the electrical contact of the first die 102 located on the second side (e.g. back side) 102b of the first die 102 may be configured as a source/drain contact of the first die 102, the first electrical contact of the second die 103 located on the first side (e.g. front side) 103a of the second die 103 may be configured as a first source/drain contact of the second die 103 and the second electrical contact of the second die 103 located on the second side (e.g. back side) 103b of the second die 103 may be configured as a second source/drain contact of the second die 103.

In accordance with an embodiment, the electrical contact of the first die 102 located on the second side (e.g. back side) 102b of the first die 102 may be configured as a drain contact of the first die 102. In accordance with an embodiment, the first electrical contact of the second die 103 located on the first side (e.g. front side) 103a of the second die 103 may be configured as a source contact of the second die 103, and the second electrical contact of the second die 103 located on the second side (e.g. back side) 103b of the second die 103 may be configured as a drain contact of the second die 103.

In accordance with an embodiment, a source/drain contact (e.g. a drain contact) of the first die 102 located on the first die 102's second side (e.g. back side) 102b may electrically contact the first side (e.g. upper side) 101a of the carrier 101 while a first source/drain contact (e.g. a source contact) of the second die 103 located on the second die 103's first side (e.g. front side) 103a may electrically contact the second side (e.g. lower side) 101b of the carrier 101 and a second source/drain contact (e.g. a drain contact) of the second die 103 located on the second die 103's second side (e.g. back side) 103b may be electrically contacted by the electrical contact structure 105 leading through the opening 104 in the carrier 101.

Illustratively, in accordance with an embodiment, a back side drain contact (e.g. pad or metallization) and a front side source contact (e.g pad or metallization) of two dies 102, 103 located on opposite sides 101a, 101b of a carrier 101 may be electrically connected with one another via the carrier 101, while a back side drain contact (e.g. pad or metallization) of one die 103 of the two dies 102, 103 may be electrically contacted by an electrical contact structure 105 leading through an opening 104 in the carrier 101.

In accordance with another embodiment, a source/drain contact (e.g. a drain contact) of the first die 102 located on the first die 102's second side (e.g. back side) 102b may electrically contact the first side (e.g. upper side) 101a of the carrier 101 while a first source/drain contact (e.g. a source contact) of the second die 103 located on the second die 103's first side (e.g. front side) 103a may be electrically contacted by the electrical contact structure 105 leading through the opening 104 in the carrier 101 and a second source/drain contact (e.g. a drain contact) of the second die 103 located on the second die 103's second side (e.g. back side) may electrically contact the second side (e.g. lower side) 101b of the carrier 101.

Illustratively, in accordance with an embodiment, back side drain contacts (e.g. pads or metallizations) of two dies 102, 103 located on opposite sides 101a, 101b of a carrier 101 may be electrically connected with one another via the carrier 101, while a front side source contact (e.g. pad or metallization) of one die 103 of the two dies 102, 103 may be electrically contacted by an electrical contact structure 105 leading through an opening 104 in the carrier 101.

In accordance with an embodiment, the carrier 101 may include a second opening leading from the first side (e.g. upper side) 101a of the carrier 101 to the second side (e.g. lower side) 101b of the carrier 101 (not shown in FIG. 1, see e.g. FIG. 5). The second opening may be located between the first region 101' of the carrier 101 and a third region of the carrier 101 (not shown in FIG. 1, see e.g. FIG. 5). The second opening may include a side wall (or side walls) that may illustratively be formed by the carrier 101 (e.g. by the first region 101' and the third region of the carrier 101) (not shown in FIG. 1, see e.g. FIG. 5).

The second opening may further be configured and/or formed in a similar manner as the opening 104 in the carrier 101, for example in accordance with one or more embodiments described herein above in connection with the opening 104.

In accordance with some embodiments, the opening 104 and the second opening of the carrier 101 may laterally be arranged at opposite sides (or ends) of the first region 101' of the carrier 101.

In accordance with an embodiment, the carrier 101 may include a third region that may be electrically insulated from at least the first region 101' of the carrier 101 (not shown in FIG. 1, see e.g. FIG. 5), for example by means of the second opening in the carrier 101.

In accordance with an embodiment, the third region of the carrier 101 may be located laterally proximate (in other words, close to or near) the first region 101' of the carrier 101.

In accordance with an embodiment, the third region of the carrier 101 may be electrically insulated from the first region 101' of the carrier 101 and from at least one other region of the carrier 101, for example from the second region 101" of the carrier 101. In accordance with an embodiment, the third region of the carrier may be electrically insulated from the remaining regions or parts of the carrier 101 (in other words, from the rest of the carrier 101). Illustratively, in accordance with an embodiment, the third region of the carrier 101 may be configured as an insulated "isle" of the carrier 101.

In accordance with an embodiment, the second die 103 may include a third electrical contact that may be located on the first side (e.g. front side) 103a of the second die 103 (not shown in FIG. 1, see e.g. FIG. 5).

In accordance with an embodiment, the third electrical contact of the second die 103 may be configured as a gate contact of the second die 103.

In accordance with an embodiment, the die arrangement 100 may include a second electrical contact structure that may electrically contact the third electrical contact of the second die 103 (not shown in FIG. 1, see e.g. FIG. 5). The second electrical contact structure may include or may be made of similar materials as the electrical contact structure.

In accordance with an embodiment, the second electrical contact structure may be disposed over the first side (e.g. upper side) 101a of the carrier 101 in the third region of the carrier 101 and may electrically contact the third region of the carrier 101 (not shown, see e.g. FIG. 5), and the third electrical contact (e.g. gate contact) of the second die 103 may be disposed over the second side (e.g. lower side) 101b of the carrier 101 in the third region of the carrier 101 and may electrically contact the third region of the carrier 101. Illustratively, the third electrical contact (e.g. gate contact) of the second die 103 may be electrically contacted by the second electrical contact structure via the third region of the carrier 101 in accordance with an embodiment.

Figure 14:
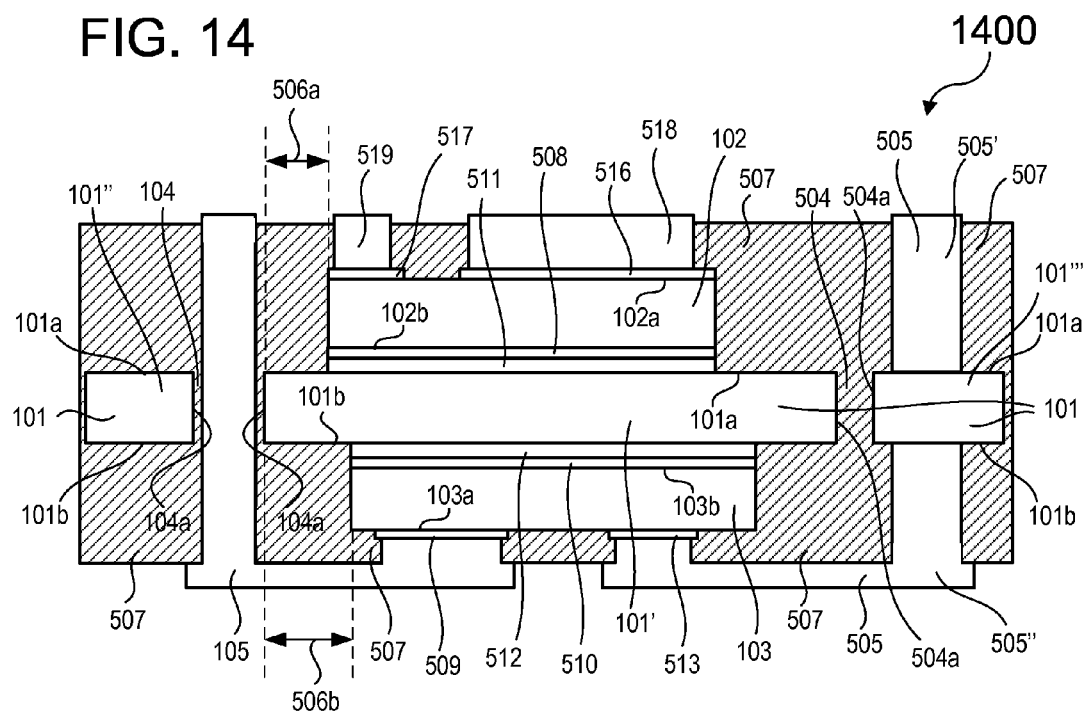
FIG. 14 shows a schematic cross-sectional view of a die arrangement in accordance with an embodiment.

In accordance with another embodiment, the second electrical contact structure may include a first portion disposed over and electrically contacting the first side (e.g. upper side) 101a of the carrier 101 in the third region of the carrier 101, and a second portion disposed over and electrically contacting the second side (e.g. lower side) 101b of the carrier 101 in the third region of the carrier 101 (not shown in FIG. 1, see e.g. FIG. 14).

Illustratively, in accordance with an embodiment, a first portion of the second electrical contact structure and a second portion of the second electrical contact structure may be electrically connected with one another via the third region of the carrier 101. In other words, the third region of the carrier 101 may form an intermediate portion of the second electrical contact structure. Thus, in accordance with some embodiments, the die arrangement 100 may be configured such that electrical current may flow from the first portion of the second electrical contact structure towards the second portion of the second electrical contact structure (or vice versa) via the third region of the carrier 101.

In accordance with an embodiment, the second portion of the second electrical contact structure may further be in contact with the third electrical contact (e.g. gate contact) of the second die 103.

Figure 7:
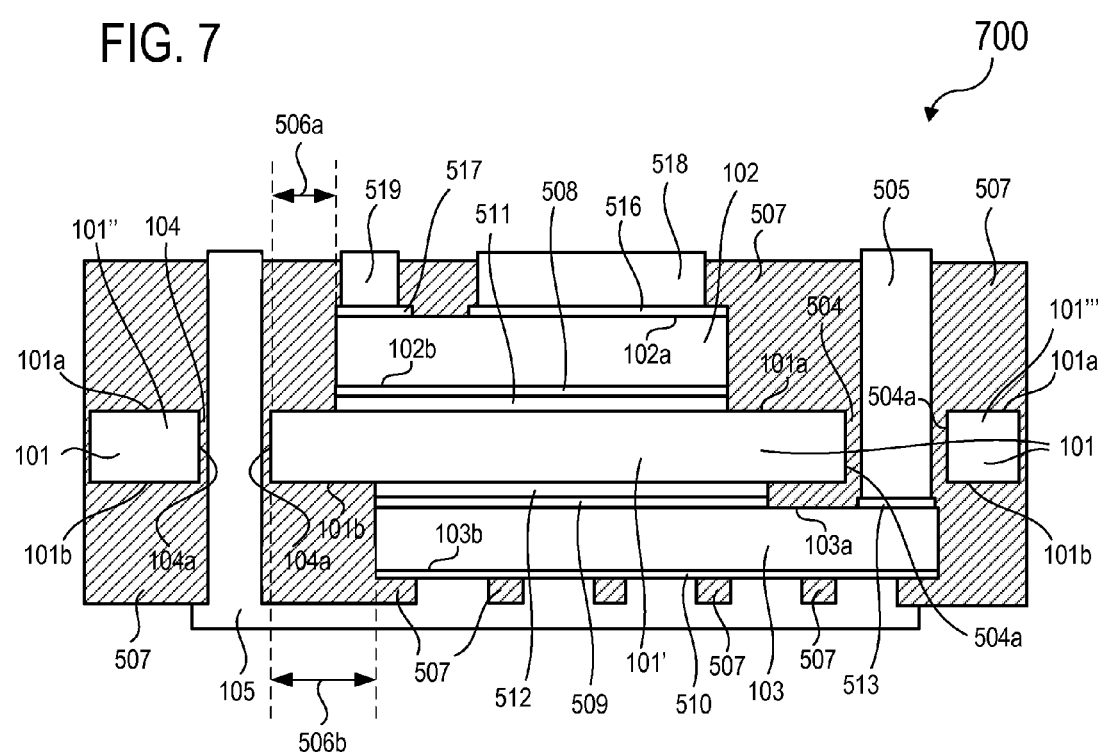
FIG. 7 shows a schematic cross-sectional view of a die arrangement in accordance with an embodiment.

In accordance with another embodiment, the second electrical contact structure may lead through the second opening and may be disposed over and electrically contact the third electrical contact (e.g. gate contact) of the second die 103 (not shown, see e.g. FIG. 7). In accordance with an embodiment, at least a part of the third electrical contact (e.g. gate contact) of the second die 103 may be arranged below the second opening. In accordance with an embodiment, the third electrical contact (e.g. gate contact) of the second die 103 may be arranged completely below (in other words, directly below) the second opening. In other words, a lateral cross-section of the second opening may encompass or cover a lateral-cross section of the third electrical contact of the second die 103 in accordance with an embodiment. In accordance with another embodiment, the third electrical contact of the second die 103 may be arranged only partially below the second opening. Illustratively, the third electrical contact (e.g. gate contact) of the second die 103 may be electrically contacted by the second electrical contact structure leading through the second opening in the carrier 101.

In accordance with an embodiment, an electrically insulating layer may be disposed at least over the side wall (or side walls) of the second opening (not shown, see e.g. FIG. 7).

In accordance with an embodiment, the electrical insulating layer may be disposed at least between the side wall (or side walls) of the second opening and a portion of the second electrical contact structure located within the second opening. In accordance with an embodiment, the electrically insulating layer may electrically insulate the second electrical contact structure from at least the first region 101' of the carrier 101. Illustratively, a side wall (or side walls) of the second opening may be clad with electrically insulating material in accordance with some embodiments.

In accordance with another embodiment, the second electrical contact structure may be spaced apart from the side wall (or side walls) of the second opening such that a gap (or gaps) may be formed in the second opening between the second electrical contact structure and the side wall (or side walls). The gap(s) may serve as electrical insulation of the second electrical contact structure.

In accordance with an embodiment, the second electrical contact structure may be configured and/or formed in a similar manner as the electrical contact structure 105, for example in accordance with one or more embodiments described herein above in connection with the electrical contact structure 105.

In accordance with an embodiment, at least one of the first die 102 and the second die 103 may be configured as a power die (or power chip). For example, at least one of the first die 102 and the second die 103 may include at least one power circuit, e.g. a power IC (integrated circuit). The power circuit(s) may, for example, include one or more power devices, e.g. power transistors, in accordance with an embodiment. The power circuit(s) or power device(s) of each die 102, 103 may be provided with electrical supply and/or control potentials (e.g. source/drain potentials, gate potential) via respective electrical contacts of the first die 102 and the second die 103.

In accordance with some embodiments, the power circuit(s) of the first die 102 and the second die 103 may be connected with one another via the carrier 101 (e.g. the first region 101' of the carrier 101), and may further be connected with the periphery and/or other dies, for example by means of the electrical contact structure 105 and/or the second electrical contact structure and/or other electrical contact structures, in accordance with an embodiment.

In accordance with an embodiment, the first die 102 may be configured as or may include a low-side device, for example a low-side transistor (illustratively, a transistor whose source contact may be coupled to a low electrical supply potential (e.g. VSS or ground potential) and whose drain contact may be coupled to an intermediate node), and the second die 103 may be configured as or may include a high-side device, for example a high-side transistor (illustratively, a transistor whose drain contact may be coupled to a high electrical supply potential (e.g. VDD potential) and whose source contact may be coupled to the intermediate node).

Figure 9:
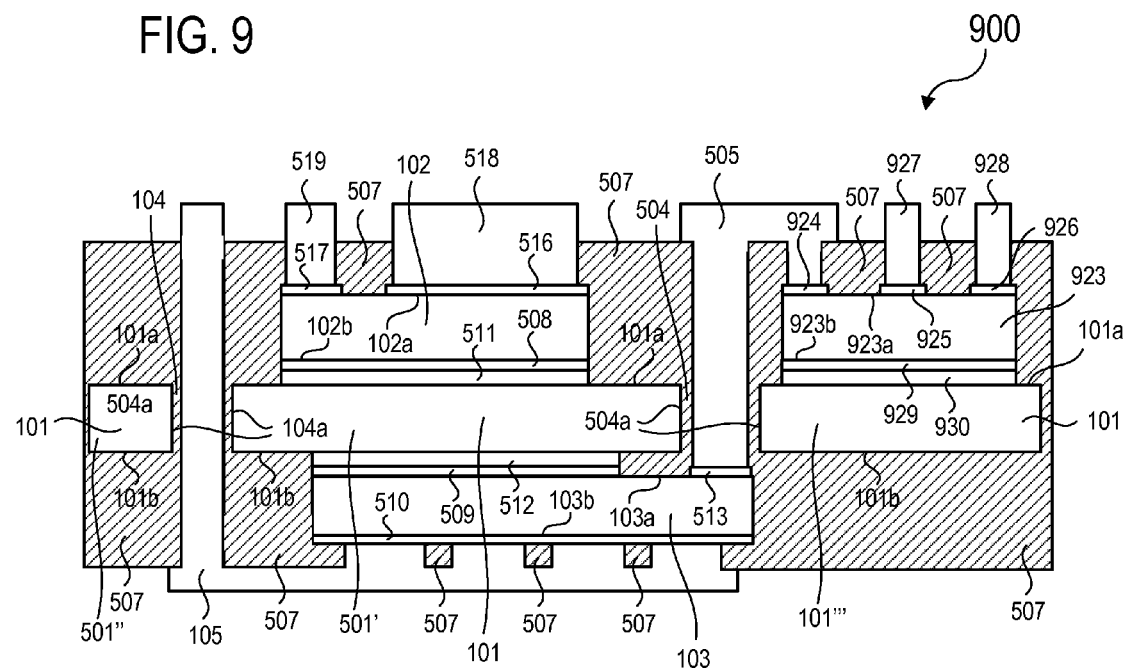
FIG. 9 shows a schematic cross-sectional view of a die arrangement in accordance with an embodiment.

In accordance with an embodiment, the die arrangement 100 may include a third die that may, for example, be disposed over the first side (e.g. upper side) 101*a* of the carrier 101 (not shown in FIG. 1, see e.g. FIG. 9). In accordance with an embodiment, the third die may be disposed over the first side (e.g. upper side) 101*a* of the carrier 101 in the third region of the carrier 101.

In accordance with an embodiment, the third die may have a first side and a second side opposite the first side. In accordance with an embodiment, the first side of the third die may be a front side of the third die and the second side of the third die may be a back side of the third die.

In accordance with an embodiment, the third die may be disposed over the first side 101*a* (e.g. upper side) of the carrier 101 in such a manner that the second side (e.g. back side) of the third die faces the first side 101*a* of the carrier 101.

In accordance with an embodiment, the third die may include at least one electrical contact (e.g. pad or metallization) located on the first side (e.g. front side) of the third die and/or at least one electrical contact (e.g. pad or metallization) located on the second side (e.g. back side) of the third die.

In accordance with an embodiment, the third die may be electrically contacted by the second electrical contact structure.

In accordance with an embodiment, the third die may include an electrical contact that may be located on the first side (e.g. front side) of the third die and may be electrically contacted by the second electrical contact structure. In accordance with an embodiment, the electrical contact of the third die located on the first side (e.g. front side) of the third die may be configured to provide an electrical potential (for example an electrical control potential, e.g. a gate control potential).

In accordance with an embodiment, the electrical potential (for example, electrical control potential, e.g. gate control potential) provided by the electrical contact of the third die may be supplied to the third electrical contact (e.g. gate contact) of the second die 103.

In accordance with an embodiment, the third die may include at least one additional electrical contact. In accordance with an embodiment, at least one of the at least one additional electrical contact of the third die may be configured to receive an electrical potential, for example an electrical supply potential. In accordance with an embodiment, at least one of the at least one additional electrical contact of the third die may be located on the first side (e.g. front side) of the third die.

In accordance with an embodiment, the third die may be configured as a logic die (or logic chip). For example, the third die may include at least one logic circuit, e.g. a logic IC (integrated circuit). The logic circuit(s) may, for example, include one or more logic devices, e.g. logic transistors, in accordance with an embodiment. The logic circuit(s) or logic device(s) of the third die may be provided with electrical potentials (e.g. electrical supply potentials) via respective electrical contacts of the third die.

In accordance with an embodiment, the first die 102 may include at least one additional electrical contact that may be located on the first side (e.g. upper side) 102*a* of the first die 102 (not shown in FIG. 1, see e.g. FIG. 5). For example, in accordance with an embodiment, the at least one additional electrical contact of the first die 102 may include an additional source/drain contact (for example, a source contact in accordance with an embodiment), and/or a gate contact.

In accordance with an embodiment, in addition to the second electrical contact structure, additional electrical contact structures may lead through the second opening. In case that more than one electrical contact structure lead through the second opening, the individual electrical contact structures may be electrically insulated from one another and/or from the side wall (or side walls) of the second opening, e.g. by means of one or more electrically insulating layers disposed between adjacent electrical contact structures and/or between electrical contact structures and the side wall (or side walls) of the second opening.

In case that more than one electrical contact structure lead through the second opening, all of the electrical contact structures may electrically contact the second die 103, in accordance with an embodiment. For example, in accordance with an embodiment, the electrical contact structures may electrically contact various (different) electrical contacts of the second die 103. In accordance with another embodiment, two or more (e.g., three, four, . . . , all) of the electrical contact structures may electrically contact the same electrical contact of the second die 103.

Alternatively, in case that more than one electrical contact structure lead through the second opening, at least one of the electrical contact structures may electrically contact a die (or dies) other than the second die 103. In accordance with an embodiment, the other die (or dies) may be disposed over the second side 101*b* of the carrier 101. In accordance with an embodiment, the at least one other die may be disposed over the second side 101*b* of the carrier 101 in a region of the carrier 101 that may be electrically insulated from the first region 101' of the carrier 101.

Figure 2:
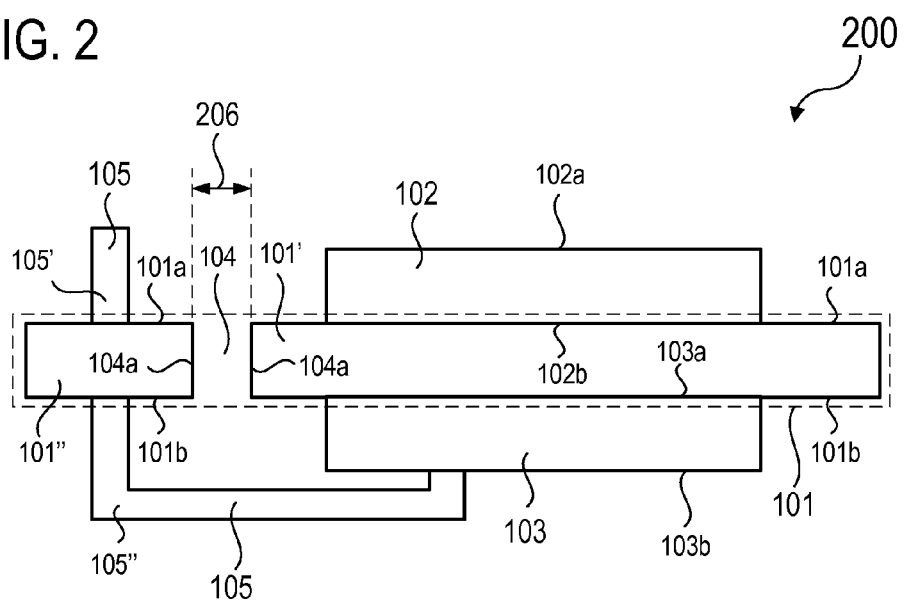
FIG. 2 shows a schematic cross-sectional view of a die arrangement in accordance with an embodiment.

FIG. 2 shows a schematic cross-sectional view of a die arrangement 200 in accordance with another embodiment. The die arrangement 200 may include a carrier 101 having a first side 101*a* and a second side 101*b* opposite the first side 101*a*. The carrier 101 may include a first region 101' and a second region 101" that may be electrically insulated from the first region 101'. The die arrangement 200 may further include a first die 102 disposed over the first side 101*a* of the carrier 101 in the first region 101' of the carrier 101 and electrically contacting the first region 101' of the carrier 101. The die arrangement 200 may further include a second die 103 disposed over the second side 101*b* of the carrier 101 in the first region 101' of the carrier 101 and electrically contacting the first region 101' of the carrier 101. The die arrangement 200 may further include an electrical contact structure 105 that may lead from the first side 101a of the carrier 101 to the second side 101b of the carrier 101 via the second region 101" of the carrier 101 and may electrically contact the second die 103.

In accordance with some embodiments, the carrier 101 may include or may be made of an electrically conductive material, such as for example metal.

A carrier that is made of metal may also be referred to as a metal carrier or metallic carrier.

In accordance with an embodiment, the electrically conductive material may include or may be at least one of the following materials: copper (Cu), aluminum (Al), silver (Ag), tin (Sn), iron (Fe). In accordance with other embodiments, the electrically conductive material may include or may be other materials.

A carrier that is made of metal may also be referred to as a metal carrier or metallic carrier.

In accordance with an embodiment, the carrier 101 may be configured as a chip carrier or circuit carrier.

In accordance with an embodiment, the carrier 101 may be configured as a metal strip, for example as a thin metal strip in accordance with an embodiment, for example having a thickness in the range from about 30 μm to about 3 mm in accordance with an embodiment, for example in the range from about 30 μm to about 100 μm in accordance with an embodiment, or for example in the range from about 150 μm to about 250 μm in accordance with another embodiment, or for example in the range from about 1 mm to about 3 mm in accordance with another embodiment.

In accordance with an embodiment, the carrier 101 may be configured as a lead frame.

In accordance with an embodiment, the first side 101a of the carrier 101 may be an upper side of the carrier 101 and the second side 101b of the carrier 101 may be a lower side of the carrier 101, as shown in FIG. 2.

In accordance with some embodiments, the first die 102 and the second die 103 may be electrically connected with one another via the first region 101' of the carrier 101. Thus, in accordance with some embodiments, the die arrangement 200 may be configured such that electrical current may flow from the first die 102 towards the second die 103 (or vice versa) via the first region 101' of the carrier 101.

The first region 101' of the carrier 101 may correspond to a region of the carrier 101, over which at least a part of the first die 102 and the second die 103 may be disposed. For example, the first region 101' of the carrier 101 may correspond to a region of the carrier 101 that may be electrically contacted by an electrical contact of the first die 102 located on a second side 102b of the first die 102, as will be described below. Furthermore, the first region 101' of the carrier 101 may correspond to a region of the carrier 101 that may be electrically contacted by a first electrical contact of the second die 103 located on a first side 103a of the second die 103 or by a second electrical contact of the second die 103 located on a second side 103b of the second die 103 opposite the first side 103a, as will be described below.

In accordance with an embodiment, the die arrangement 200 may include an opening 104 in the carrier 101 leading from the first side (e.g. upper side) 101a of the carrier 101 to the second side (e.g. lower side) 101b of the carrier 101, as shown. The opening 104 may be located between the first region 101' and the second region 101" of the carrier 101, as shown. In accordance with an embodiment, the opening 104 may be laterally spaced apart from at least one of the first die 102 and the second die 103, as shown in FIG. 2.

Illustratively, the second region 101" of the carrier 101 may be laterally spaced apart from the first region 101' of the carrier 101 by the opening 104. The opening 104 may include a side wall (or side walls) 104a that may illustratively be formed by the carrier 101 (e.g. by the first region 101' and the second region 101" of the carrier 101), as shown.

In accordance with some embodiments, the second region 101" of the carrier 101 may be electrically insulated from the first region 101' of the carrier 101 by means of the opening 104.

In accordance with an embodiment, the second region 101" of the carrier 101 may be electrically insulated from the first region 101' of the carrier 101 and from at least one other region of the carrier 101. In accordance with an embodiment, the second region 101" of the carrier 101 may be electrically insulated from the remaining regions or parts of the carrier 101 (in other words, from the rest of the carrier 101). Illustratively, in accordance with an embodiment, the second region 101" of the carrier 101 may be configured as an insulated "isle" of the carrier 101.

In accordance with an embodiment, the second region 101" of the carrier 101 may be located laterally proximate (in other words, close to or near) the first region 101' of the carrier 101. For example, a lateral distance 206 between the second region 101" of the carrier 101 and the first region 101' of the carrier 101 may be in the range from about 50 μm to about 400 μm in accordance with an embodiment, for example in the range from about 50 μm to about 100 μm in accordance with an embodiment, or for example in the range from about 100 μm to about 250 μm in accordance with another embodiment, or for example in the range from about 250 μm to about 400 μm in accordance with another embodiment. In accordance with some embodiments, the lateral distance 206 between the first region 101' and the second region 101" of the carrier 101 may correspond to a diameter of the opening 104, as shown.

Figure 11:
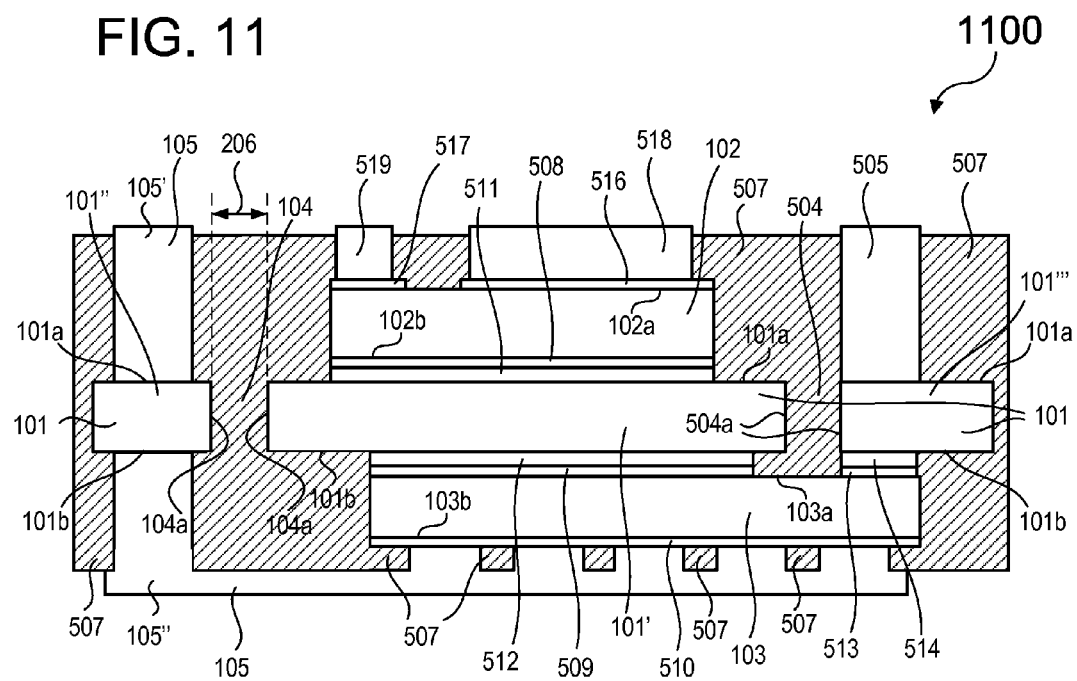
FIG. 11 shows a schematic cross-sectional view of a die arrangement in accordance with an embodiment.

In accordance with an embodiment, an electrically insulating layer may be disposed at least in the opening 104 between the first region 101' and the second region 101" of the carrier 101 (not shown, see e.g. FIG. 11).

In accordance with an embodiment, the opening 104 may be formed in the carrier 101 using at least one of the following processes: an etch process, a laser ablation process, a die-cutting process, a punching process. In accordance with other embodiments, any other process that may be suitable to form at least one opening or hole in a carrier (for example, in a metal carrier, e.g. a lead frame) may be used.

A lateral cross-section of the opening 104 may have an arbitrary shape, for example a circular shape, an elliptical shape, a rectangular shape, a quadratic shape, or a polygonal shape in accordance with some embodiments, or any other shape in accordance with other embodiments.

In accordance with an embodiment, the electrical contact structure 105 may include or may be made of electrically conductive material such as, for example, metal. In accordance with an embodiment, the electrically conductive material may include or may be copper (Cu), aluminum (Al), nickel (Ni), silver (Ag), tin (Sn), gold (Au). In accordance with other embodiments, other electrically conductive materials may be used.

In accordance with an embodiment, the electrical contact structure 105 may include a first portion 105' disposed over and electrically contacting the first side (e.g. upper side) 101a of the carrier 101 in the second region 101" of the carrier 101, and a second portion 105" disposed over and electrically contacting the second side (e.g. lower side) 101b of the carrier 101 in the second region 101" of the carrier 101, as shown. Illustratively, in accordance with an embodiment, a first portion 105' of the electrical contact structure 105 may be disposed over the second region 101" of the carrier 101 from one side (e.g. from above), and a second portion 105" of the electrical contact structure 105 may be disposed over the second region 101" of the carrier 101 from the opposite side (e.g. from below). The second portion 105" of the electrical contact structure 105 may further be in contact with the second die 103 (for example with an electrical contact of the second die 103), as shown. In accordance with some embodiments, the second portion 105" of the electrical contact structure 105 may electrically contact a side of the second die 103 that faces away from the second side (e.g. lower side) 101b of the carrier 101.

Illustratively, the first portion 105' of the electrical contact structure 105 and the second portion 105" may be electrically connected with one another via the second region 101" of the carrier 101. In other words, the second region 101" of the carrier may form an intermediate portion of the electrical contact structure 105. Thus, in accordance with some embodiments, the die arrangement 200 may be configured such that electrical current may flow from the first portion 105' of the electrical contact structure 105 towards the second portion 105" of the electrical contact structure 105 (or vice versa) via the second region 101" of the carrier 101.

In accordance with an embodiment, forming the electrical contact structure 105 may include forming an electrically insulating layer on both sides of the carrier 101, forming a first contact hole (via) in the electrically insulating layer that leads to the first side (e.g. upper side) 101a of the carrier 101 in the second region 101" of the carrier 101 and forming a second contact hole (via) in the electrically insulating layer that leads to the second side (e.g. lower side) 101b of the carrier 101 in the second region 101" of the carrier 101, and filling the first and second vias with electrically conductive material. In accordance with other embodiments, forming the electrical contact structure 105 may include or may be achieved using other processes or process sequences.

In accordance with an embodiment, the first die 102 may have a first side 102a and a second side 102b opposite the first side 102a, as shown. In accordance with an embodiment, the second die 103 may have a first side 103a and a second side 103b opposite the first side 103a, as shown.

In accordance with an embodiment, the first side 102a of the first die 102 may be a front side of the first die 102 and the second side 102b of the first die 102 may be a back side of the first die 102. In accordance with an embodiment, the first side 103a of the second die 103 may be a front side of the second die 103 and the second side 103b of the second die 103 may be a back side of the second die 103.

In accordance with an embodiment, the first die 102 may be disposed over the first side (e.g. upper side) 101a of the carrier 101 in such a manner that the second side (e.g. back side) 102b of the first die 102 faces the first side (e.g. upper side) 101a of the carrier 101, and the second die 103 may be disposed over the second side 101b (e.g. lower side) of the carrier 101 in such a manner that the first side (e.g. front side) 103a of the second die 103 faces the second side (e.g. lower side) 101b of the carrier 101, as shown.

Figure 15:
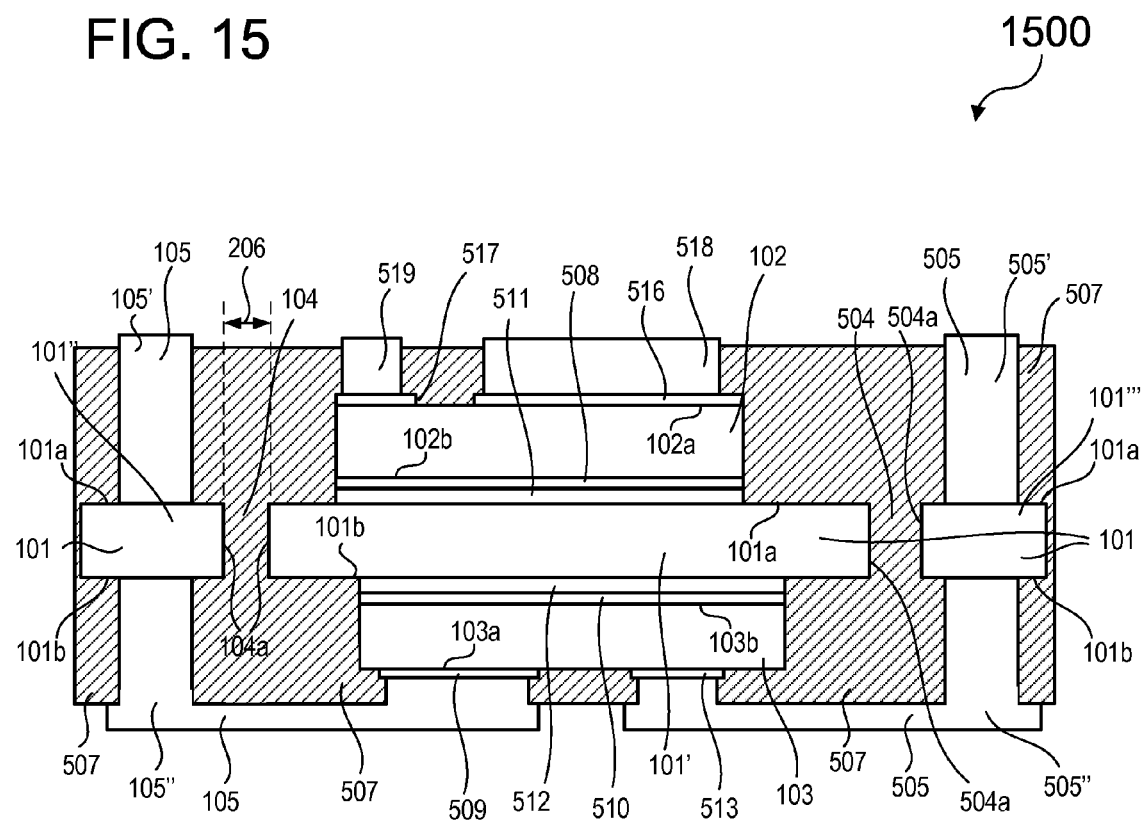
FIG. 15 shows a schematic cross-sectional view of a die arrangement in accordance with an embodiment.

In accordance with another embodiment, the first die 102 may be disposed over the first side (e.g. upper side) 101a of the carrier 101 in such a manner that the second side (e.g. back side) 102b of the first die 102 faces the first side (e.g. upper side) 101a of the carrier 101, and the second die 103 may be disposed over the second side (e.g. lower side) 101b of the carrier 101 in such a manner that the second side (e.g. back side) 103b of the second die 103 faces the second side (e.g. lower side) 101b of the carrier 101 (not shown in FIG. 2, see e.g. FIG. 15).

In accordance with an embodiment, the first die 102 may include at least one electrical contact (e.g. pad or metallization) located on the first side (e.g. front side) 102a of the first die 102 and/or at least one electrical contact (e.g. pad or metallization) located on the second side (e.g. back side) 102b of the first die 102 (not shown in FIG. 2, see e.g. FIG. 11).

In accordance with an embodiment, the second die 103 may include at least one electrical contact (e.g. pad or metallization) located on the first side (e.g. front side) 103a of the second die 103 and/or at least one electrical contact (e.g. pad or metallization) located on the second side (e.g. back side) 103b of the second die 103 (not shown in FIG. 2, see e.g. FIG. 11).

In accordance with an embodiment, the first die 102 may include an electrical contact that may be located on the second side (e.g. back side) 102b of the first die 102, and the second die 103 may include a first electrical contact that may be located on the first side (e.g. front side) 103a of the second die 103 and a second electrical contact that may be located on the second side (e.g. back side) 103b of the second die 103 (not shown in FIG. 2, see e.g. FIG. 11).

In accordance with an embodiment, the first die 102 may be disposed over the first side (e.g. upper side) 101a of the carrier 101 in the first region 101' of the carrier 101 in such a manner that the electrical contact of the first die 102 located on the second side (e.g. back side) 102b of the first die 102 electrically contacts the first region 101' of the carrier 101, and the second die 103 may be disposed over the second side (e.g. lower side) 101b of the carrier 101 in the first region 101' of the carrier 101 in such a manner that the first electrical contact of the second die 103 located on the first side (e.g. front side) 103a of the second die 103 electrically contacts the first region 101' of the carrier 101 and the second electrical contact of the second die 103 located on the second side (e.g. back side) 103b of the second die 103 is electrically contacted by the electrical contact structure 105 leading via the second region 101" of the carrier 101 (not shown in FIG. 2, see e.g. FIG. 11).

In accordance with an embodiment, the first die 102's electrical contact located on the second side (e.g. back side) 102b of the first die 102 may be electrically connected with the second die 103's first electrical contact located on the first side (e.g. front side) 103a of the second die 103 via the first region 101' of the carrier 101 disposed in-between.

Illustratively, in accordance with an embodiment, a back side electrical contact (e.g. pad or metallization) and a front side electrical contact (e.g. pad or metallization) of two dies 102, 103 located on opposite sides 101a, 101b of a carrier 101 may be electrically connected with one another via a first region 101' of the carrier 101, while a back side electrical contact (e.g. pad or metallization) of one die 103 of the two dies 102, 103 may be electrically connected by an electrical contact structure 105 leading via a second region 101" of the carrier 101 that is electrically insulated from the first region 101' of the carrier 101 (not shown in FIG. 2, see e.g. FIG. 11).

In accordance with another embodiment, the first die 102 may be disposed over the first side (e.g. upper side) 101a of the carrier 101 in the first region 101' of the carrier 101 in such a manner that the electrical contact of the first die 102 located on the second side (e.g. back side) 102b of the first die 102 electrically contacts the first region 101' of the carrier 101, and the second die 103 may be disposed over the second side (e.g. lower side) 101b of the carrier 101 in the first region 101' of the carrier 101 in such a manner that the second electrical contact of the second die 103 located on the second side (e.g. back side) 103*b* of the second die 103 electrically contacts the first region 101' of the carrier 101 and the first electrical contact of the second die 103 located on the first side (e.g. front side) 103*a* of the second die 103 is electrically contacted by the electrical contact structure 105 leading via the second region 101" of the carrier 101 (not shown in FIG. 2, see e.g. FIG. 15).

In accordance with an embodiment, the first die 102's electrical contact located on the second side (e.g. back side) 102*b* of the first die 102 may be electrically connected with the second die 103's second electrical contact located on the second side (e.g. back side) 103*b* of the second die 103 via the first region 101' of the carrier 101 disposed in-between.

Illustratively, in accordance with an embodiment, back side electrical contacts (e.g. pads or metallizations) of two dies 102, 103 located on opposite sides 101*a*, 101*b* of a carrier 101 may be electrically connected with one another via a first region 101' of the carrier 101, while a front side electrical contact (e.g. pad or metallization) of one die 103 of the two dies 102, 103 may be electrically contacted by an electrical contact structure 105 leading via a second region 101" of the carrier 101 that is electrically insulated from the first region 101' of the carrier 101 (not shown in FIG. 2, see e.g. FIG. 15).

In accordance with an embodiment, the electrical contact of the first die 102 located on the second side (e.g. back side) 102*b* of the first die 102 may be configured as a source/drain contact of the first die 102, the first electrical contact of the second die 103 located on the first side (e.g. front side) 103*a* of the second die 103 may be configured as a first source/drain contact of the second die 103 and the second electrical contact of the second die 103 located on the second side (e.g. back side) 103*b* of the second die 103 may be configured as a second source/drain contact of the second die 103.

Illustratively, in accordance with an embodiment, a source/drain contact of the first die 102 located on the first die 102's second side (e.g. back side) 102*b* may electrically contact the first side (e.g. upper side) 101*a* of the carrier 101 in the first region 101' of the carrier 101 while a first source/drain contact of the second die 103 located on the second die 103's first side (e.g. front side) 103*a* may electrically contact the second side (e.g. lower side) 101*b* of the carrier 101 in the first region 101' of the carrier 101 and a second source/drain contact of the second die 103 located on the second die 103's second side (e.g. back side) 103*b* may be electrically contacted by the electrical contact structure 105 leading via the second region 101" of the carrier 101.

In accordance with an embodiment, the electrical contact of the first die 102 located on the second side (e.g. back side) 102*b* of the first die 102 may be configured as a drain contact of the first die 102. In accordance with an embodiment, the first electrical contact of the second die 103 located on the first side (e.g. front side) 103*a* of the second die 103 may be configured as a source contact of the second die 103, and the second electrical contact of the second die 103 located on the second side (e.g. back side) 103*b* of the second die 103 may be configured as a drain contact of the second die 103.

Illustratively, in accordance with an embodiment, a back side drain contact (e.g. pad or metallization) and a front side source contact (e.g. pad or metallization) of two dies 102, 103 located on opposite sides 101*a*, 101*b* of a carrier 101 may be electrically connected with one another via a first region 101' of the carrier 101, while a back side drain contact (e.g. pad or metallization) of one die 103 of the two dies 102, 103 may be electrically connected by an electrical contact structure 105 leading via a second region 101" of the carrier 101 that is electrically insulated from the first region 101' of the carrier 101 (not shown in FIG. 2, see e.g. FIG. 11).

In accordance with another embodiment, a source/drain contact (e.g. a drain contact) of the first die 102 located on the first die 102's second side (e.g. back side) 102*b* may electrically contact the first side (e.g. upper side) 101*a* of the carrier 101 while a first source/drain contact (e.g. a source contact) of the second die 103 located on the second die 103's first side (e.g. front side) 103*a* may be electrically contacted by the electrical contact structure 105 leading via the second region 101" of the carrier 101 and a second source/drain contact (e.g. a drain contact) of the second die 103 located on the second die 103's second side (e.g. back side) may electrically contact the second side (e.g. lower side) 101*b* of the carrier 101.

Illustratively, in accordance with an embodiment, back side drain contacts (e.g. pads or metallizations) of two dies 102, 103 located on opposite sides 101*a*, 101*b* of a carrier 101 may be electrically connected with one another via a first region 101' of the carrier 101, while a front side source contact (e.g. pad or metallization) of one die 103 of the two dies 102, 103 may be electrically contacted by an electrical contact structure 105 leading via a second region 101" of the carrier 101 that is electrically insulated from the first region 101' of the carrier 101 (not shown in FIG. 2, see e.g. FIG. 15).

In accordance with an embodiment, the carrier 101 may include a third region that may be electrically insulated from at least the first region 101' of the carrier 101 (not shown, see e.g. FIG. 11).

In accordance with an embodiment, the third region of the carrier 101 may be located laterally proximate (in other words, close to or near) the first region 101' of the carrier 101. For example, a lateral distance between the third region and the first region 101' of the carrier 101 may be similar to the lateral distance 206 between the second region 101" and the first region 101' of the carrier 101.

In accordance with an embodiment, the third region of the carrier 101 may be electrically insulated from the first region 101' of the carrier 101 and from at least one other region of the carrier 101, for example the second region 101" of the carrier 101. In accordance with an embodiment, the third region of the carrier 101 may be electrically insulated from the remaining regions or parts of the carrier 101 (in other words, from the rest of the carrier 101). Illustratively, in accordance with an embodiment, the third region of the carrier 101 may be configured as an insulated "isle" of the carrier 101.

In accordance with an embodiment, the second die 103 may include a third electrical contact that may be located on the first side (e.g. front side) 103*a* of the second die 103 (not shown, see e.g. FIG. 11).

In accordance with an embodiment, the third electrical contact of the second die 103 may be configured as a gate contact of the second die 103.

In accordance with an embodiment, the die arrangement 200 may include a second electrical contact structure that may electrically contact the third electrical contact of the second die 103 (not shown, see e.g. FIG. 11). The second electrical contact structure may include or may be made of similar materials as the electrical contact structure 105.

In accordance with an embodiment, the second electrical contact structure may be disposed over the first side (e.g. upper side) 101*a* of the carrier 101 in the third region of the carrier and may electrically contact the third region of the carrier 101, and the third electrical contact (e.g. gate contact) of the second die 103 may be disposed over the second side (e.g. lower side) 101*b* of the carrier 101 in the third region of the carrier 101 and may electrically contact the third region of the carrier 101 (not shown, see e.g. FIG. 11). Illustratively, the third electrical contact (e.g. gate contact) of the second die 103 may be electrically contacted by the second electrical contact structure via the third region of the carrier 101 in accordance with an embodiment.

In accordance with another embodiment, the second electrical contact structure may include a first portion disposed over and electrically contacting the first side (e.g. upper side) 101a of the carrier 101 in the third region of the carrier 101, and a second portion disposed over and electrically contacting the second side (e.g. lower side) 101b of the carrier 101 in the third region of the carrier 101 (not shown in FIG. 2, see e.g. FIG. 15). Illustratively, in accordance with an embodiment, a first portion of the second electrical contact structure may be disposed over the third region of the carrier 101 from one side (e.g. from above), and a second portion of the second electrical contact structure may be disposed over the third region of the carrier 101 from the opposite side (e.g. from below).

Illustratively, in accordance with an embodiment, a first portion of the second electrical contact structure and a second portion of the second electrical contact structure may be electrically connected with one another via the third region of the carrier 101. In other words, the third region of the carrier 101 may form an intermediate portion of the second electrical contact structure. Thus, in accordance with some embodiments, the die arrangement 200 may be configured such that electrical current may flow from the first portion of the second electrical contact structure towards the second portion of the second electrical contact structure (or vice versa) via the third region of the carrier 101.

In accordance with an embodiment, the second portion of the second electrical contact structure may further be in contact with the third electrical contact (e.g. gate contact) of the second die 103.

In accordance with an embodiment, the die arrangement 200 may include a second opening in the carrier 101 leading from the first side (e.g. upper side) 101a of the carrier 101 to the second side (e.g. lower side) 101b of the carrier 101 (not shown, see e.g. FIG. 11). The second opening may be located between the first region 101' and the third region of the carrier 101. The second opening may include a side wall (or side walls) that may illustratively be formed by the carrier 101 (e.g. by the first region 101' and the third region of the carrier 101).

The second opening may further be configured and/or formed in a similar manner as the opening 104 in the carrier 101, for example in accordance with one or more embodiments described herein above in connection with the opening 104.

In accordance with an embodiment, the opening 104 and the second opening of the carrier 101 may laterally be arranged at opposite sides (or ends) of the first region 101' of the carrier 101.

In accordance with some embodiments, the third region of the carrier 101 may be electrically insulated from the first region 101' (and possibly additional regions) of the carrier 101 by means of the second opening and/or one or more electrically insulating layers disposed between the first region 101' and the third region of the carrier 101.

Figure 12:
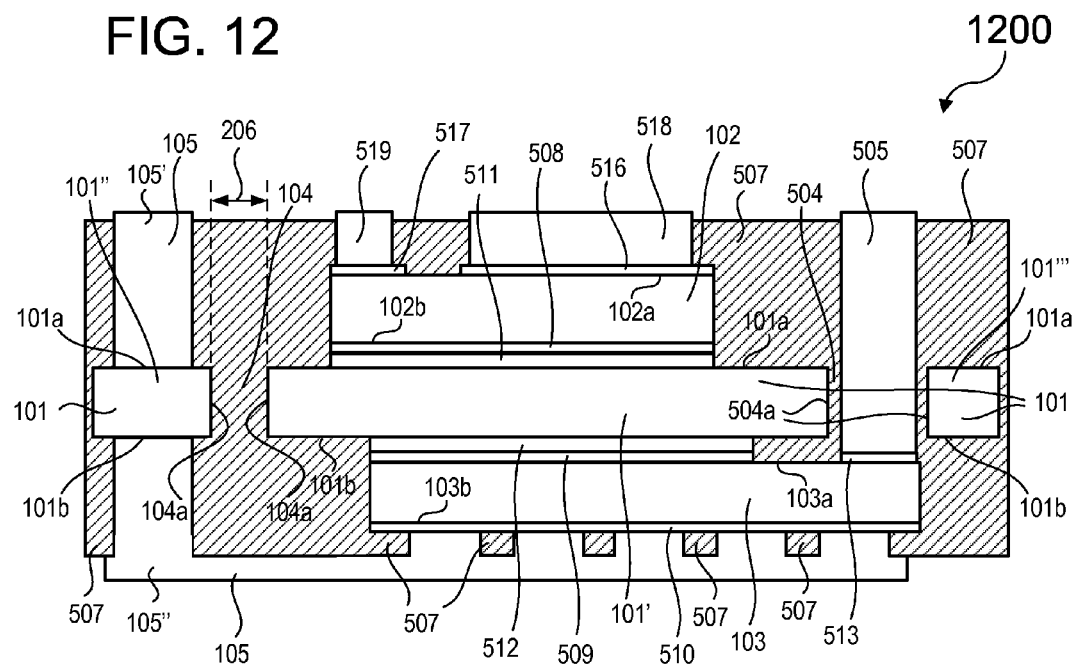
FIG. 12 shows a schematic cross-sectional view of a die arrangement in accordance with an embodiment.

In accordance with an embodiment, the second electrical contact structure may lead through the second opening and may be disposed over and electrically contact the third electrical contact (e.g. gate contact) of the second die 103 (not shown, see e.g. FIG. 12). In accordance with an embodiment, at least a part of the third electrical contact (e.g. gate contact) of the second die 103 may be arranged below the second opening. In accordance with an embodiment, the third electrical contact (e.g. gate contact) of the second die 103 may be arranged completely below (in other words, directly below) the second opening. Illustratively, the third electrical contact (e.g. gate contact) of the second die 103 may be electrically contacted by the second electrical contact structure leading through the second opening in the carrier 101.

In accordance with an embodiment, the second opening may be laterally spaced apart from at least one of the first die 102 and the second die 103.

In accordance with an embodiment, the second opening may be formed laterally proximate (in other words, close to or near) at least one of the first die 102 and the second die 103.

In accordance with an embodiment, an electrically insulating layer may be disposed at least over the side wall (or side walls) of the second opening.

In accordance with an embodiment, the electrical insulating layer may be disposed at least between the side wall (or side walls) of the second opening and a portion of the second electrical contact structure located within the second opening. In accordance with an embodiment, the electrically insulating layer may electrically insulate the second electrical contact structure from at least the first region 101' of the carrier 101. Illustratively, a side wall (or side walls) of the second opening may be clad with electrically insulating material in accordance with some embodiments.

In accordance with another embodiment, the second electrical contact structure may be spaced apart from the side wall (or side walls) of the second opening such that a gap (or gaps) may be formed in the second opening between the second electrical contact structure and the side wall (or side walls), the gap(s) serving as electrical insulation of the second electrical contact structure.

In accordance with an embodiment, the second electrical contact structure may include electrically conductive material. For example, the electrical contact structure may include or may be made of one or more electrically conductive materials such as, for example, copper (Cu), aluminum (Al), nickel (Ni), silver (Ag), tin (Sn), gold (Au). In accordance with other embodiments, the second electrical contact structure may include or may be made of other electrically conductive materials.

In accordance with an embodiment, at least one of the first die 102 and the second die 103 may be configured as a power die (or power chip). For example, at least one of the first die 102 and the second die 103 may include at least one power circuit, e.g. a power IC (integrated circuit). The power circuit(s) may, for example, include one or more power devices, e.g. power transistors, in accordance with an embodiment. The power circuit(s) or power device(s) of each die 102, 103 may be provided with electrical supply and/or control potentials (e.g. source/drain potentials, gate potential) via respective electrical contacts of the first die 102 and the second die 103.

In accordance with an embodiment, the first die 102 may be configured as or may include a low-side device, for example a low-side transistor (illustratively, a transistor whose source contact may be coupled to a low electrical supply potential (e.g. VSS or ground potential) and whose drain contact may be coupled to an intermediate node), and the second die 103 may be configured as or may include a high-side device, for example a high-side transistor (illustratively, a transistor whose drain contact may be coupled to a high electrical supply potential (e.g. VDD potential) and whose source contact may be coupled to the intermediate node).

In accordance with an embodiment, the die arrangement 200 may include a third die that may be disposed over the first side 101a (e.g. upper side) of the carrier 101. In accordance with an embodiment, the third die may be disposed over the first side 101a (e.g. upper side) of the carrier 101 in the third region of the carrier 101.

In accordance with an embodiment, the third die may have a first side and a second side opposite the first side. In accordance with an embodiment, the first side of the third die may be a front side of the third die and the second side of the third die may be a back side of the third die.

In accordance with an embodiment, the third die may be disposed over the first side 101a (e.g. upper side) of the carrier 101 in such a manner that the second side (e.g. back side) of the third die faces the first side 101a (e.g. upper side) of the carrier 101.

In accordance with an embodiment, the third die may include at least one electrical contact (e.g. pad or metallization) located on the first side (e.g. front side) of the third die and/or at least one electrical contact (e.g. pad or metallization) located on the second side (e.g. back side) of the third die.

In accordance with an embodiment, the third die may be electrically contacted by the second electrical contact structure.

In accordance with an embodiment, the third die may include an electrical contact that may be located on the first side (e.g. front side) of the third die and may be electrically contacted by the second electrical contact structure. In accordance with an embodiment, the electrical contact of the third die located on the first side (e.g. front side) of the third die may be configured to provide an electrical potential (for example an electrical control potential, e.g. a gate control potential).

In accordance with an embodiment, the electrical potential (for example, electrical control potential, e.g. gate control potential) provided by the electrical contact of the third die may be supplied to the third electrical contact (e.g. gate contact) of the second die 103.

In accordance with an embodiment, the third die may include at least one additional electrical contact. In accordance with an embodiment, at least one of the at least one additional electrical contact of the third die may be configured to receive an electrical potential, for example an electrical supply potential. In accordance with an embodiment, at least one of the at least one additional electrical contact of the third die may be located on the first side (e.g. front side) of the third die.

In accordance with an embodiment, the third die may be configured as a logic die (or logic chip). For example, the third die may include at least one logic circuit, e.g. a logic IC (integrated circuit). The logic circuit(s) may, for example, include one or more logic devices, e.g. logic transistors, in accordance with an embodiment. The logic circuit(s) or logic device(s) of the third die may be provided with electrical potentials (e.g. electrical supply potentials) via respective electrical contacts of the third die.

In accordance with an embodiment, the first die 102 may include at least one additional electrical contact that may be located on the first side (e.g. front side) 102a of the first die 102 (not shown, see e.g. FIG. 11). For example, in accordance with an embodiment, the at least one additional electrical contact of the first die 102 may include an additional source/drain contact (for example, a source contact in accordance with an embodiment) and/or a gate contact.

In accordance with an embodiment, in addition to the second electrical contact structure, additional electrical contact structures may lead through the second opening. In case of several electrical contact structure leading through the second opening, the individual electrical contact structures may be electrically insulated from one another and/or from the side wall (or side walls) of the second opening, e.g. by means of one or more electrically insulating layers.

In case that several electrical contact structures lead through the second opening, all of the electrical contact structures may electrically contact the second die 103, in accordance with an embodiment. For example, in accordance with an embodiment, the electrical contact structures may electrically contact various (different) electrical contacts of the second die 103. In accordance with another embodiment, two or more (e.g., three, four, . . . , all) of the electrical contact structures may electrically contact the same electrical contact of the second die 103.

Alternatively, in case that several electrical contact structures lead through the second opening, at least one of the electrical contact structures may electrically contact a die (or dies) other than the second die 103. In accordance with an embodiment, the other die (or dies) may be disposed over the second side 101b of the carrier 101. In accordance with an embodiment, the at least one other die may be disposed over the second side 101b of the carrier 101 in a region of the carrier 101 that may be electrically insulated from the first region 101' of the carrier 101.

In accordance with an embodiment, the electrically conductive material of at least one of the contact structures of the die arrangement 200 may include or may be a metal such as, for example, copper (Cu), aluminum (Al), nickel (Ni), silver (Ag), tin (Sn), gold (Au). In accordance with other embodiments, at least one of the electrical contact structures of the die arrangement 200 may include or may be made of other electrically conductive materials.

Figure 3:
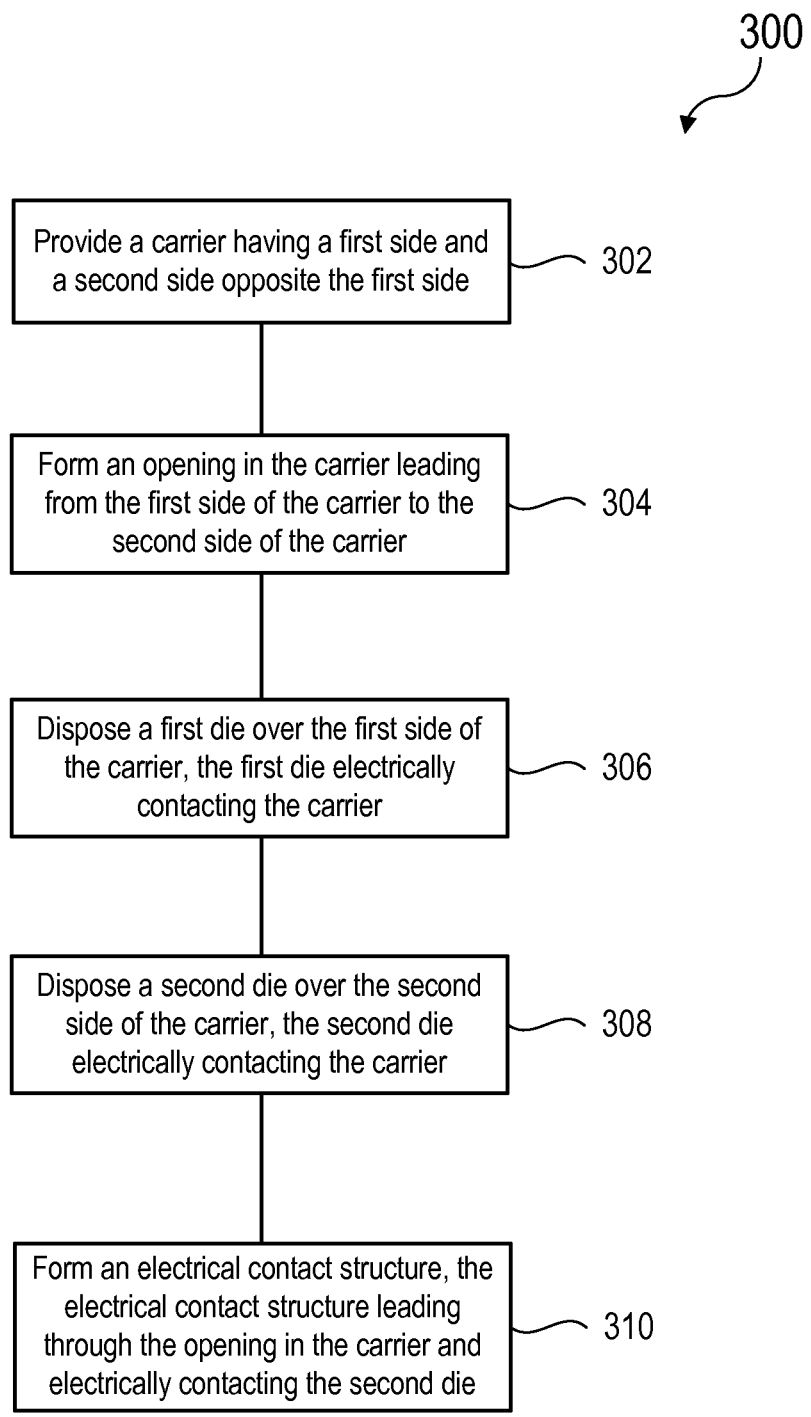
FIG. 3 is a diagram illustrating a method of forming a die arrangement in accordance with an embodiment.

FIG. 3 shows a diagram 300 illustrating a method of forming a die arrangement in accordance with an embodiment.

In 302, a carrier is provided, the carrier having a first side and a second side opposite the first side. The carrier may further be configured in accordance with one or more embodiments described herein.

In 304, an opening may be formed in the carrier leading from the first side of the carrier to the second side of the carrier. In accordance with an embodiment, the opening may be formed in the carrier using at least one of an etch process, a laser ablation process, a die-cutting process, a punching process. In accordance with other embodiments, the opening may be formed using other suitable processes such as, for example, any process that may be suitable to form an opening or hole in a carrier (for example, in a metal carrier, e.g. a lead frame). The opening may further be configured in accordance with one or more embodiments described herein.

In 306, a first die may be disposed over the first side of the carrier, the first die electrically contacting the carrier. The first die may further be configured in accordance with one or more embodiments described herein.

In 308, a second die may be disposed over the second side of the carrier, the second die electrically contacting the carrier. The second die may further be configured in accordance with one or more embodiments described herein.

In 310, an electrical contact structure may be formed, the electrical contact structure leading through the opening in the carrier and electrically contacting the second die. The electrical contact structure may further be configured in accordance with one or more embodiments described herein.

In accordance with an embodiment, the opening may be formed in the carrier before the first die and/or the second die are/is disposed over the carrier. In accordance with another embodiment, the opening may be formed in the carrier after the first die and/or the second die are/is disposed over the carrier.

The die arrangement 300 may further be configured in accordance with one or more embodiments described herein.

Figure 4:
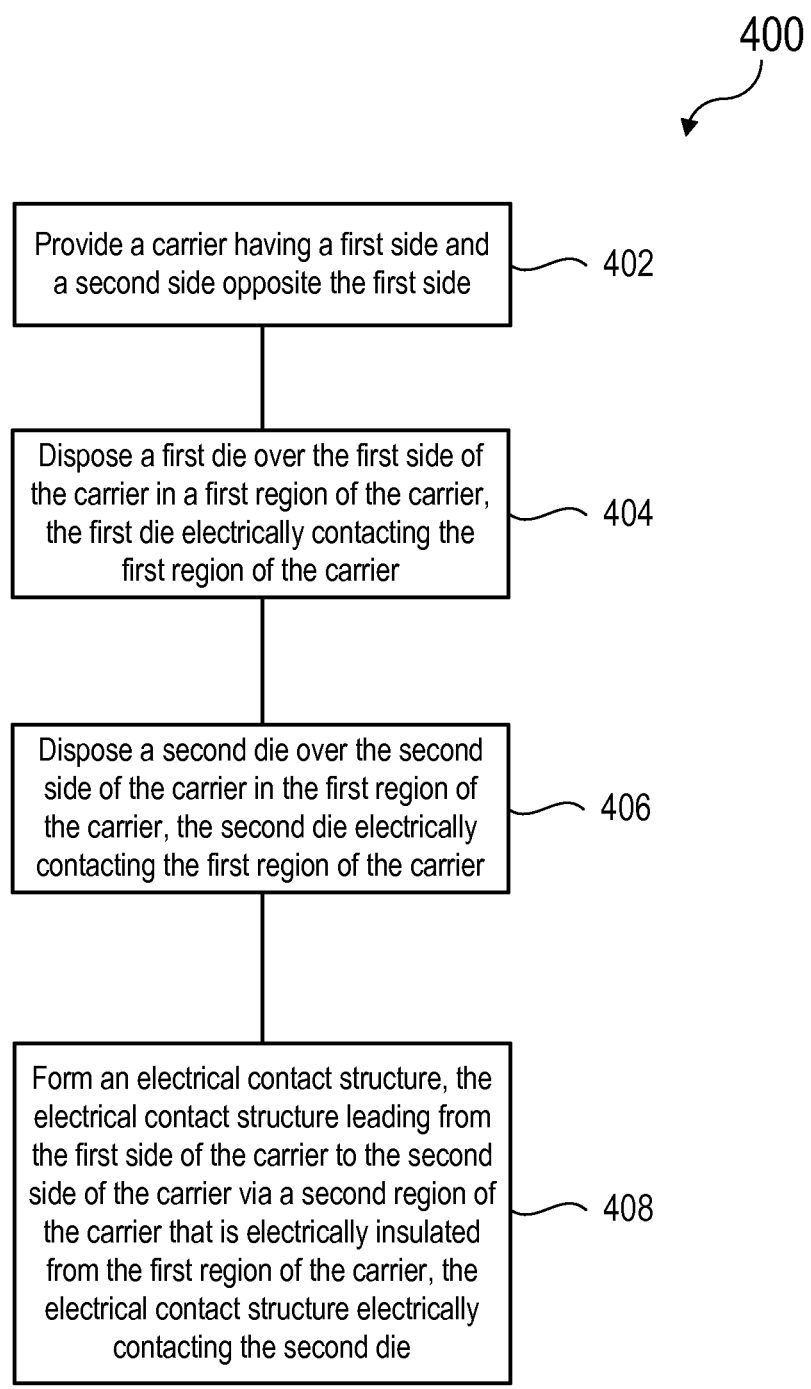
FIG. 4 is a diagram illustrating a method of forming a die arrangement in accordance with an embodiment.

FIG. 4 shows a diagram 400 illustrating a method of forming a die arrangement in accordance with another embodiment.

In 402, a carrier may be provided, the carrier having a first side and a second side opposite the first side. The carrier may further be configured in accordance with one or more embodiments described herein.

In 404, a first die may be disposed over the first side of the carrier in a first region of the carrier, the first die electrically contacting the first region of the carrier. The first die may further be configured in accordance with one or more embodiments described herein.

In 406, a second die may be disposed over the second side of the carrier in the first region of the carrier, the second die electrically contacting the first region of the carrier. The second die may further be configured in accordance with one or more embodiments described herein.

In 408, an electrical contact structure may be formed, the electrical contact structure leading from the first side of the carrier to the second side of the carrier via a second region of the carrier that is electrically insulated from the first region of the carrier, the electrical contact structure electrically contacting the second die. The electrical contact structure may further be configured in accordance with one or more embodiments described herein.

The die arrangement 400 may further be configured in accordance with one or more embodiments described herein.

FIG. 5 shows a schematic cross-sectional view of a die arrangement 500 in accordance with an embodiment.

The die arrangement 500 may include a carrier 101 having a first side 101a and a second side 101b opposite the first side 101a. The carrier 101 may include an opening 104 leading from the first side 101a of the carrier to the second side 101b of the carrier 101. The die arrangement 500 may further include a first die 102 disposed over the first side 101a of the carrier 101 and electrically contacting the carrier 101. The die arrangement 500 may further include a second die 103 disposed over the second side 101b of the carrier 101 and electrically contacting the carrier 101. The die arrangement 500 may further include an electrical contact structure 105 leading through the opening 104 in the carrier 101 and electrically contacting the second die 103.

The carrier 101 may include a first region 101' and a second region 101". The opening 104 may be formed between the first region 101' and the second region 101" of the carrier 101, as shown. The first region 101' of the carrier 101 may correspond to a region of the carrier 101, over which at least a part of the first die 102 and the second die 103 may be disposed, as shown. The first region 101' may correspond to a region of the carrier 101 that may be electrically contacted by an electrical contact 508 of the first die 102 located on a second side 102b of the first die 102, as will be described below. Furthermore, the first region 101' of the carrier 101 may correspond to a region of the carrier 101 that may be electrically contacted by a first electrical contact 509 of the second die 103 located on a first side 103a of the second die 103, as will be described below. The second region 101" of the carrier 101 may be electrically insulated from the first region 101' of the carrier 101.

The carrier 101 may further include a third region 101''' and a second opening 504 that may be located between the first region 101' and the third region 101'''. The third region 101''' may be electrically insulated from the first region 101' by means of at least the second opening 504.

The carrier 101 may, for example, be a metal carrier, for example a thin metal strip. In accordance with an embodiment, the carrier 101 may be configured as a lead frame, for example as a copper lead frame.

The first side 101a of the carrier 101 may be an upper side of the carrier 101 and the second side 101b of the carrier 101 may be a lower side of the carrier 101, as shown.

The first die 102 and the second die 103 may be electrically connected with one another via the first region 101' of the carrier 101, as shown Thus, the die arrangement 500 may be configured such that electrical current may flow from the first die 102 towards the second die 103 (or vice versa) via the first region 101' of the carrier 101.

The opening 104 may be laterally spaced apart from the first die 102 and the second die 103, as shown.

In accordance with an embodiment, the opening 104 may be formed laterally proximate (in other words, close to or near) the first die 102 and the second die 103. For example, in accordance with an embodiment, at least one of a lateral distance 506a between the opening 104 and the first die 102 and a lateral distance 506b between the opening 104 and the second die 103 may be in the range from about . . . to about . . . , for example in the range from about . . . to about . . . in accordance with an embodiment, e.g. about . . . in accordance with an embodiment.

In accordance with an embodiment, the lateral distance 506a between the opening the 104 and the first die 102 may be smaller than the lateral distance 506b between the opening 104 and the second die 103, as shown. In accordance with another embodiment, the lateral distance 506b between the opening 104 and the second die 103 may be smaller than the lateral distance 506a between the opening 104 and the first die 102. In accordance with still another embodiment, the lateral distances 506a and 506b may be the same.

The electrical contact structure 105 may be electrically insulated from the carrier 101 by means of an electrically insulating layer 507. In accordance with an embodiment, the electrically insulating layer 507 may have been formed or deposited by means of a lamination process, in other words by means of laminating electrical insulating material onto the carrier 101 and onto the first and second dies 102, 103 disposed over the carrier 101, as will be described further below. In accordance with other embodiments, the electrically insulating layer 507 may have been formed or deposited using other suitable processes, e.g. other suitable deposition processes such as, for example, a lamination process, a molding encapsulation process, or a poly-imide/polymer coating process.

The opening 104 may include side walls 104a that may illustratively be formed by the carrier 101 (e.g by the first region 101' and the second region 101" of the carrier 101), as shown.

The electrically insulating layer 507 may be disposed between the side walls 104a of the opening 104 and the electrical contact structure 105, thereby electrically insulating the electrical contact structure 105 from the carrier 101, as shown.

A lateral cross-section of the opening 104 may have an arbitrary shape, for example a circular shape, an elliptical shape, a rectangular shape, a quadratic shape, or a polygonal shape in accordance with some embodiments, or any other shape in accordance with other embodiments.

In accordance with an embodiment, the lateral cross-section of the opening 104 may have a diameter (indicated by double-arrow 116 in FIG. 5) in the range from about . . . to about . . . , for example in the range from about . . . to about . . . in accordance with an embodiment, e.g. about . . . in accordance with an embodiment.

The electrical contact structure 105 may include or may be made of an electrically conductive material such as, for example, a metal. In accordance with an embodiment, the electrical contact structure 105 may include or may be made of copper (Cu). In accordance with other embodiments, the electrical contact structure 105 may include or may be made of other materials.

The electrically conductive material of the electrical contact structure 105 may fill the opening 104 with the electrical contact structure 105 being electrically insulated from the side walls 104a by means of the electrically insulating layer 507 disposed between the electrically conductive material of the electrical contact structure 105 and the side walls 104a of the opening 104, as shown.

The first die 102 and the second die 103 may each have a first side 102a, 103a and a second side 102b, 103b opposite the first side 102a, 103a. The first side 102a of the first die 102 may be a front side of the first die 102 and the second side 102b of the first die 102 may be a back side of the first die 102, as shown. Likewise, the first side 103a of the second die 103 may be a front side of the second die 103 and the second side 103b of the second die 103 may be a back side of the second die 103, as shown.

The first die 102 may be disposed over the first side 101a (upper side) of the carrier 101 in such a manner that the second side 102b (back side) of the first die 102 faces the first side 101a (upper side) of the carrier 101, and the second die 103 may be disposed over the second side 101b (lower side) of the carrier 101 in such a manner that the first side 103a (front side) of the second die 103 faces the second side 101b (lower side) of the carrier 101, as shown.

The first die 102 may include an electrical contact 508 that is located on the second side 102b (back side) of the first die 102, and the second die 103 may include a first electrical contact 509 that is located on the first side 103a (front side) of the second die 103 and a second electrical contact 510 that is located on the second side 103b (back side) of the second die 103, as shown.

The first die 102 may be disposed over the first side 101a (upper side) of the carrier 101 in such a manner that the electrical contact 508 of the first die 102 located on the second side 102b (back side) of the first die 102 electrically contacts the first region 101' of the carrier 101, and the second die 103 may be disposed over the second side 101b (lower side) of the carrier 101 in such a manner that the first electrical contact 509 of the second die 103 located on the first side 103a (front side) of the second die 103 electrically contacts the first region 101' of the carrier 101 and the second electrical contact 510 of the second die 103 located on the second side 103b (back side) of the second die 103 is electrically contacted by the electrical contact structure 105, as shown.

Illustratively, the first die 102's electrical contact 508 located on the back side 102b of the first die 102 may be electrically connected with the second die 103's first electrical contact 509 located on the front side 103a of the second die 103 via the first region 101' of the carrier 101 disposed in-between. In other words, the first die 102's electrical contact 508 on its back side 102b and the second die 103's first electrical contact 509 on its front side 103a may be electrically connected with one another via the carrier 101, while the second die 103's second electrical contact 510 located on the back side 103b of the second die 103 may be connected by the electrical contact structure 105 leading through the opening 104 in the carrier 101.

In accordance with an embodiment, an electrically conductive layer 511 may be disposed between the first die 102's electrical contact 508 and the first region 101' of the carrier 101, as shown. The electrically conductive layer 511 may serve to attach the first die 102 to the carrier 101. The electrically conductive layer 511 may for example include or may be made of an electrically conductive adhesive material (e.g. electrically conductive glue material). In accordance with other embodiments, the first die 102 may be attached to the carrier 101 using other suitable methods, for example by means of soldering.

In accordance with an embodiment, a second electrically conductive layer 512 may be disposed between the second die 103's first electrical contact 509 and the first region 101' of the carrier 101, as shown. The second electrically conductive layer 512 may serve to attach the second die 103 to the carrier 101. The second electrically conductive layer 512 may for example include or may be made of an electrically conductive adhesive material (e.g. electrically conductive glue material). In accordance with other embodiments, the second die 103 may be attached to the carrier 101 using other suitable methods, for example by means of soldering.

The electrical contact 508 of the first die 102 located on the second side 102b (back side) of the first die 102 may be configured as a source/drain contact (e.g. as a drain contact) of the first die 102, the first electrical contact 509 of the second die 103 located on the first side 103a (front side) of the second die 103 may be configured as a first source/drain contact (e.g. as a source contact) of the second die 103, and the second electrical contact 510 of the second die 103 located on the second side 103b (back side) of the second die 103 may be configured as a second source/drain contact (e.g. as a drain contact) of the second die 103.

Illustratively, a source/drain contact (e.g. drain contact) 508 of the first die 102 may electrically contact the first side 101a (upper side) of the carrier 101 while a first source/drain contact (e.g. source contact) 509 of the second die 103 may electrically contact the second side 101b (lower side) of the carrier 101 and a second source/drain contact (e.g. drain contact) 510 of the second die 103 may be electrically contacted by the electrical contact structure 105.

The second die 103 may further include a third electrical contact 513 that may be located on the first side 103a (front side) of the second die 103, as shown.

The third electrical contact 513 of the second die 103 may be configured as a gate contact of the second die 103.

The third electrical contact (e.g. gate contact) 513 of the second die 103 located on the first side 103a (front side) of the second die 103 may electrically contact the third region 101''' of the carrier 101 that is electrically insulated from the first region 101' of the carrier 101. The first region 101' of the carrier 101 may, for example, be electrically insulated from the third region 101''' of the carrier 101 by means of the second opening 504 in the carrier 101 filled by the electrically insulating layer 507, as shown. Illustratively, the third region 101''' of the carrier 101 may be an insulated "isle" of the carrier 101. As shown, the third electrical contact (e.g. gate contact) 513 may contact the second side 101b (lower side) of the carrier 101 in the third region 101''' of the carrier 101.

In accordance with an embodiment, a third electrically conductive layer 514 may be disposed between the second die 103's third electrical contact (e.g. gate contact) 513 and the third region 101''' of the carrier 101. The electrically conductive layer 514 may serve to attach the third electrical contact (e.g. gate contact) 513 of the second die 103 to the third region 101''' of the carrier 101. The electrically conductive layer 514 may for example include or may be made of an electrically conductive adhesive material (e.g. electrically conductive glue material). In accordance with other embodiments, the third electrical contact (e.g. gate contact) 513 of the second die 103 may be attached to the third region 101''' of the carrier 101 using other suitable methods, for example by means of soldering.

The first die 102 may include a second electrical contact 516 that may be located on the first side 102*a* (upper side) of the first die 102, as shown. The second electrical contact 516 of the first die 102 may be configured as an additional source/drain contact (e.g. as a source contact) of the first die 102.

The first die 102 may include a third electrical contact 517 that may be located on the first side 102*a* (upper side) of the first die 102, as shown. The third electrical contact 517 of the first die 102 may be configured as a gate contact of the first die 102.

The die arrangement 500 may further include a second electrical contact structure 505 that may be disposed over and electrically contact the third region 101''' of the carrier 101, as shown. Illustratively, the third electrical contact (e.g. gate contact) 513 of the second die 103 may be electrically contacted by the second electrical contact structure 505 via the third region 101''' of the carrier 101, as shown.

The die arrangement 500 may further include a third electrical contact structure 518 that may be disposed over and electrically contact the second electrical contact (e.g. source contact) 516 of the first die 102. The third electrical contact structure 518 may include or may be made of similar materials as the electrical contact structure 105 and/or the second electrical contact structure 505.

The die arrangement 500 may further include a fourth electrical contact structure 519 that may be disposed over and electrically contact the third electrical contact (e.g. gate contact) 517 of the first die 102. The fourth electrical contact structure 519 may include or may be made of similar materials as the electrical contact structure 105 and/or the second electrical contact structure 505 and/or the third electrical contact structure 518.

The electrical contact structures 105, 505, 518, 519 may be electrically insulated from one another and/or from other electrical contact structures, for example by means of the electrically insulating layer 507, as shown.

At least one of the first die 102 and the second die 103 may be configured as a power die or power chip and may include at least one power circuit, e.g. a power IC (integrated circuit). The power circuit(s) may, for example, include one or more power devices, e.g. power transistors, in accordance with an embodiment. The power circuit(s) or power devices of each die 102, 103 may be provided with electrical supply and/or control potentials (e.g. source/drain potentials, gate potential) via the respective electrical contacts of the first die 102 and the second die 103. For example, in accordance with an embodiment a drain potential (e.g. VDD) may be supplied to the drain contact 510 of the second die 103 via the electrical contact structure 105, a source potential (e.g. VSS) may be supplied to the source contact 516 of the first die 102 via the third electrical contact structure 518, a first gate potential may be supplied to the gate contact 517 of the first die 102 via the fourth electrical contact structure 519, and a second gate potential may be supplied to the gate contact 513 of the second die 103 via the second electrical contact structure 505 and the third region 101''' of the carrier 101.

Illustratively, in accordance with an embodiment, the first die 102 and the second die 103 may correspond to a series-connection of a low-side device and a high-side device.

FIGS. 6A to 6D show schematic cross-sectional views for illustrating different process stages in a method of forming the die arrangement of FIG. 5 in accordance with an embodiment. Parts or elements with the same reference numerals as in FIG. 5 are the same as in FIG. 5 and will not be redescribed here in detail again for the sake of brevity; specific embodiments of those parts or elements described above in connection with FIG. 5 apply here as well and reference is made to the description above.

FIG. 6A shows in a first cross-sectional view 620 that a carrier 101 is provided. In accordance with an embodiment, the carrier 101 may be configured as a metal strip (for example, as a lead frame in accordance with an embodiment, e.g. as a copper lead frame in one embodiment).

An opening 104 may be formed in the carrier 101 leading from an upper side 101*a* of the carrier 101 to a lower side 101*b* of the carrier 101. The opening 104 may, for example, be formed in the carrier 101 using at least one of an etch process, a laser ablation process, a die-cutting process, a punching process. In accordance with other embodiments, the opening 104 may be formed using other suitable processes. The opening includes side walls 104*a* formed by the carrier 101.

A second opening 504 may be formed in the carrier 101 leading from the upper side 101*a* of the carrier 101 to the lower side 101*b* of the carrier 101.

The carrier 101 includes first, second and third regions 101', 101'', 101''' and 101''' separated from one another by the opening 104 and the second opening 504, as shown.

A first die 102 may be disposed over the upper side 101*a* of the carrier 101 in such a manner that a source/drain contact (e.g. drain contact) 508 located on the back side 102*b* of the first die 102 electrically contacts the first region 101' of the carrier 101. The first die 102 may be attached to the carrier 101 by means of an electrically conductive and adhesive layer 511 (e.g. electrically conductive glue layer) disposed between the drain contact 508 and the first region 101' of the carrier 101. In accordance with other embodiments, the first die 102 may be attached to the carrier 101 using other suitable processes, e.g. by means of a soldering process.

A second die 103 may be disposed over the lower side 101*b* of the carrier 101 in such a manner that a first source/drain contact (e.g. source contact) 509 of the second die 103 located on the front side 103*a* of the second die 103 electrically contacts the first region 101' of the carrier 101 and a gate contact 513 also located on the front side 103*a* of the second die 103 electrically contacts the third region 101''' of the carrier 101. The second die 103 may be attached to the carrier 101 by means of second and third electrically conductive and adhesive layers 512 and 514 (e.g. electrically conductive glue layers) disposed between the first source/drain contact (e.g. source contact) 509 of the second die 103 and the first region 101' of the carrier 101 and between the gate contact 513 of the second die 103 and the third region 101''' of the carrier 101, respectively. In accordance with other embodiments, the second die 103 may be attached to the carrier 101 using other suitable methods, e.g. by means of a soldering process.

In accordance with the embodiment shown, the first die 102 and the second die 103 may be arranged in such a manner that a lateral distance 506*a* between the opening 104 and the first die 102 is smaller than a lateral distance 506*b* between the opening 104 and the second die 103. In accordance with another embodiment, the lateral distances 506*a* and 506*b* may be the same. In accordance with still another embodiment, the lateral distance 506*b* between the opening 104 and the second die 103 may be smaller than the lateral distance 506*a* between the opening 104.

In accordance with an embodiment, the first die 102 and the second die 103 may each include a semiconductor circuit, for example an integrated circuit, for example a power circuit including one or more power devices, e.g. power transistors. In accordance with an embodiment, the first die 102 and the second die 103 may correspond to a low-side device and a high-side device that may be coupled in series with one another via the first region 101' of the carrier 101.

Illustratively, FIG. 6A shows two semiconductor circuits (i.e. first die 102 and second die 103) that are contacted to two opposite sides (upper side 101a and lower side 101b) of a carrier 101 (e.g. metal strip, e.g. lead frame) that has at least one opening (or hole) 104 leading from the upper side 101a through the carrier 101 to the lower side 101b of the carrier 101.

FIG. 6B shows in a second cross-sectional view 640 that an electrically insulating layer 507 may be disposed over the carrier 101, the first die 102 and the second die 103. The electrically insulating layer 507 may be formed such that it covers the carrier 101 and the first and second dies 102, 103 disposed over the carrier 101, as shown. Furthermore, the electrically insulating layer 507 may be formed such that it fills the opening 104 and the additional 504 (and possibly further openings) in the carrier 101.

In accordance with an embodiment, the electrically insulating layer 507 may be formed by means of a lamination process. In other words, an electrically insulating layer may be laminated onto both sides (i.e. upper side 101a and lower side 101b) of the carrier 101. For example, in accordance with an embodiment, a resin-coated metal foil (e.g. a resin-coated copper (RCC) foil in one embodiment) may be laminated as electrically insulating layer 507 onto the carrier 101 and the first and second dies 102, 103. In accordance with other embodiments, the electrically insulating layer 507 may include or may be made of other suitable materials.

In accordance with other embodiments, the electrically insulating layer 507 may be formed by means of other suitable processes, e.g. other suitable deposition processes.

FIG. 6C shows in a third cross-sectional view 660 that contact holes (vias) 621a, 621b, 621c, 621d, 621e are formed in the electrically insulating layer 507. The vias 621a, 621b, 621c, 621d, 621e serve to accommodate electrical contact structures that serve to electrically contact a second electrical contact (e.g. source contact) 516 and a third electrical contact (e.g. gate contact) 517 of the first die 102 located on the first die 102's front side 102a, and a second electrical contact (e.g. drain contact) 510 of the second die 103 located on the second die 103's back side 103b and a third electrical contact (e.g. gate contact) 513 of the second die 103 located on the second die 103's front side 103a.

In particular, a first via 621a is formed in the electrically insulating layer 507 that leads from the upper side of the arrangement through the entire electrically insulating layer 507 to the lower side of the arrangement (only one first via 621a is shown as an example, in accordance with other embodiments, more than one first via 621a may be formed). In particular, the first via 621a leads through the opening 104 in the carrier 101. The first via 621 a may be formed in such a manner that electrically insulating material of the electrically insulating layer 507 remains on the side walls 104a of the opening 104, as shown. Illustratively, the first via 621a may enable forming an electrical through-contact or through-connection through the electrically insulating layer 507.

In addition, second vias 621b are formed in the electrically insulating layer 507 that lead from the lower side of the arrangement to the second electrical contact (e.g. drain contact) 510 of the second die 103 (five second vias 621b are shown as an example, in accordance with other embodiments, a different number of second vias 621b (e.g., one, two, three, four, . . . , vias 621b) may be formed). Illustratively, the second vias 621b may enable electrically contacting the second electrical contact (e.g. drain contact) 510 of the second die 103.

In addition, a third via 621c is formed in the electrically insulating layer 507 that leads from the upper side of the arrangement to the third region 101''' of the carrier 101 (only one third via 621c is shown as an example, in accordance with other embodiments more than one third via 621c may be formed). Illustratively, the third via 621c may enable electrically contacting the third electrical contact (e.g. gate contact) 513 of the second die 103 via the third region 101''' of the carrier 101.

In addition, a fourth via 621d is formed in the electrically insulating layer 507 that leads from the upper side of the arrangement to a second electrical (e.g. source contact) 516 of the first die 102 (only one fourth via 621d is shown as an example, in accordance with other embodiments more than one fourth via 621d may be formed). Illustratively, the fourth via 621d may enable electrically contacting the second electrical contact (e.g. source contact) 516 of the first die 102.

In addition, a fifth via 621e is formed in the electrically insulating layer 507 that leads from the upper side of the arrangement to the gate contact 517 of the first die 102 (only one fifth via 621e is shown as an example, in accordance with other embodiments more than one fifth via 621e may be formed). Illustratively, the fifth via 621e may enable electrically contacting a third electrical contact (e.g. gate contact) 517 of the first die 102.

The vias 621a, 621b, 621c, 621d, 621e may be formed by removing material from the electrically insulating layer 507. In accordance with an embodiment, the removal of the material may be achieved by means of an etch process. In accordance with other embodiments, other suitable processes may be used to remove the material of the electrically insulating layer 507, such as for example, a laser-ablation process, a wet-chemical or plasma etching process, or a drilling process in accordance with some embodiments.

FIG. 6D shows in a fourth cross-sectional view 680 that electrically conductive material 622 is deposited thereby filling the vias 621a, 621b, 621c, 621d, 621e with the electrically conductive material 622 and forming the electrical contact structure 105 that electrically contacts the second electrical contact (e.g. drain contact) 510 of the second die 103 and the second, third and fourth electrical contact structures 505, 518, 519 electrically contacting the second die 103's third electrical contact (e.g. gate contact) 513, the first die 102's second electrical contact (e.g. source contact) 518 and the first die 102's third electrical contact (e.g. gate contact) 519, respectively.

In accordance with an embodiment, the electrically conductive material 622 may be copper (Cu). In accordance with other embodiments, the electrically conductive material 622 may include or may be other materials.

The electrically conductive material 622 may be deposited using a suitable deposition process such as, for example, a plasma or galvanic deposition process, or a lamination process in accordance with some embodiments.

The structure shown in FIG. 6D corresponds to the die arrangement 500 shown in FIG. 5. Illustratively, in accordance with an embodiment a drain contact 510 of the second die 103 located on the second die 103's back side 103b may be electrically contacted by the electrical contact structure 105 that leads through the opening 104 in the carrier 101 and a gate contact 513 of the second die 103 located on the second die 103's front side 103a may be electrically contacted by the second electrical contact structure 505 via the third region 101''' of the carrier 101.

FIG. 7 shows a schematic cross-sectional view of a die arrangement 700 in accordance with an embodiment.

The die arrangement 700 is to some extent similar to the die arrangement 500 shown and described in connection with FIG. 5; parts or elements with the same reference numerals as in FIG. 5 are the same as in FIG. 5 and will not be redescribed here in detail again for the sake of brevity; reference is made to the description above. In the following, emphasis will be placed on the differences between the die arrangements 500 and 700.

The die arrangement 700 is different from the die arrangement 500 of FIG. 5 in that the third electrical contact (e.g. gate contact) 513 of the second die 103 is located directly below the second opening 504 in the carrier 101 and the second electrical contact structure 505 leads through the second opening 504 and contacts the third electrical contact (e.g. gate contact 513) of the second die 103. As shown, the third electrical contact 513 may be located completely below the opening 504. In other words, a lateral cross-section of the second opening 504 may encompass or cover a lateral cross-section of the third electrical contact 513. In accordance with an embodiment, the third electrical contact 513 may be located only partially below the second opening 504. Illustratively, the second electrical contact structure 505 may be disposed on the third electrical contact (e.g. gate contact) 513 of the second die 103 without the third region 101''' of the carrier 101 being in-between (as in the die arrangement 500 of FIG. 5). The second electrical contact structure 505 may be electrically insulated from side walls 504a of the second opening 504 by means of the electrically insulating layer 507 disposed between the second electrical contact structure 505 and the side walls 504a of the second opening 504.

FIGS. 8A to 8D show schematic cross-sectional views for illustrating different process stages in a method of forming the die arrangement of FIG. 7 in accordance with an embodiment. Parts or elements with the same reference numerals as FIG. 7 are the same as in FIG. 7 and will not be redescribed here in detail again for the sake of brevity; specific embodiments of those parts or elements described above in connection with FIG. 7 apply here as well and reference is made to the description above. In addition, the individual process stages illustrated in connection with FIGS. 8A to 8D are to some extent similar to those illustrated in connection with FIGS. 6A to 6D. Therefore, again for the sake of brevity, reference is also made to the description of FIGS. 6A to 6D.

FIG. 8A shows in a first cross-sectional view 820 that a carrier 101 is provided, an opening 104 and a second opening 504 are formed in the carrier 101, and a first die 102 and a second die 103 are disposed over opposite sides (upper side 101a and lower side 101b) of the carrier 101 in a similar manner as described in connection with FIG. 6A.

In contrast to the embodiment described in connection with FIG. 6A, here the second die 103 is disposed over the lower side 101b of the carrier 101 in such a manner that the third electrical contact (e.g. gate contact) 513 is located directly below the second opening 504.

Illustratively, FIG. 8A shows two semiconductor dies (i.e. first die 102 and second die 103) that are contacted to opposite sides (upper side 101a and lower side 101b) of a carrier 101 (e.g. metal strip, e.g. lead frame) that has openings (or holes) 104, 504 leading from the upper side 101a through the carrier 101 to the lower side 101b of the carrier 101, where the second die 103 (lower die) is contacted to the carrier 101 in such a manner that a third electrical contact (e.g. gate contact) 513 of the second die 103 is located directly below an opening 504 of the carrier 101.

FIG. 8B shows in a second cross-sectional view 840 that an electrically insulating layer 507 is disposed over the carrier 101, the first die 102 and the second die 103. The electrically insulating layer 507 may be formed in a similar manner as described in connection with FIG. 6B, for example by means of a lamination process, e.g. by lamination of a resin coated metal foil (e.g. resin coated copper (RCC) foil) in accordance with an embodiment. In accordance with other embodiments, the electrically insulating layer 507 may include other materials and/or may be formed differently.

Figure 8C:
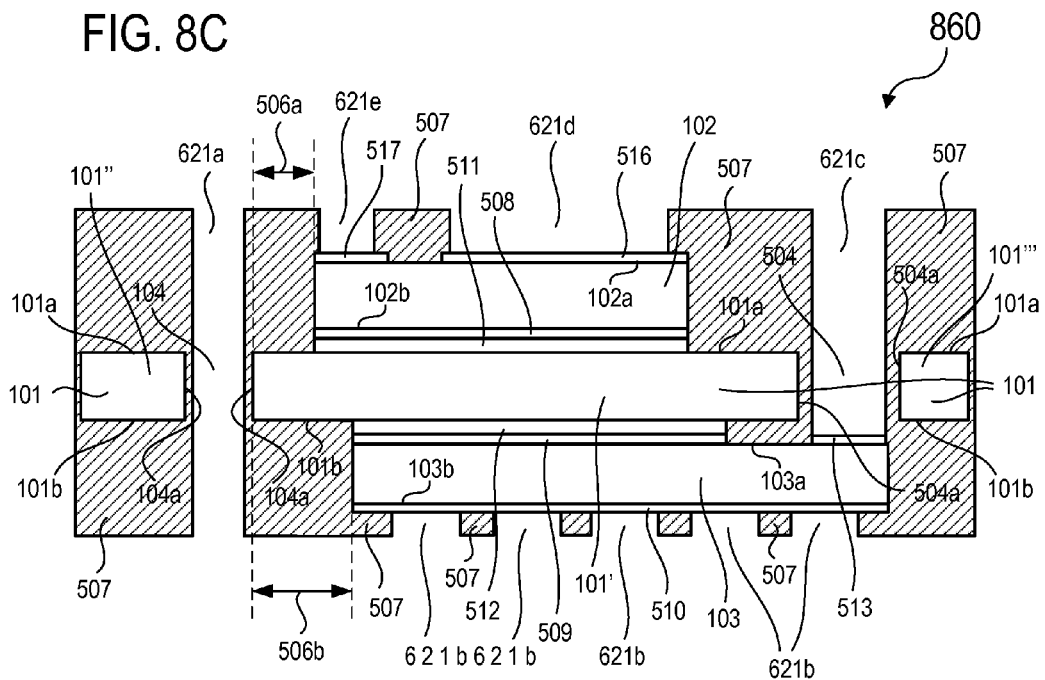

FIG. 8C shows in a third cross-sectional view 860 that contact holes (vias) 621a, 621b, 621c, 621d, 621e are formed in the electrically insulating layer 507. The first via 621a, the second vias 621b, the third via 621c, the fourth via 621d and the fifth via 621e may be formed in a similar manner as described in connection with FIG. 6C. In contrast to the embodiment described in connection with FIG. 6C, the third via 621c is formed in such a manner that it leads from the upper side of the arrangement through the second opening 504 to the third electrical contact (e.g. gate contact) 513 of the second die 103 such that the third electrical contact (e.g. gate contact) 513 of the second die 103 is exposed. The third via 621c may be formed such that electrically insulating material of the electrically insulating layer 507 remains on the side walls 504a of the second opening 504.

Figure 8D:
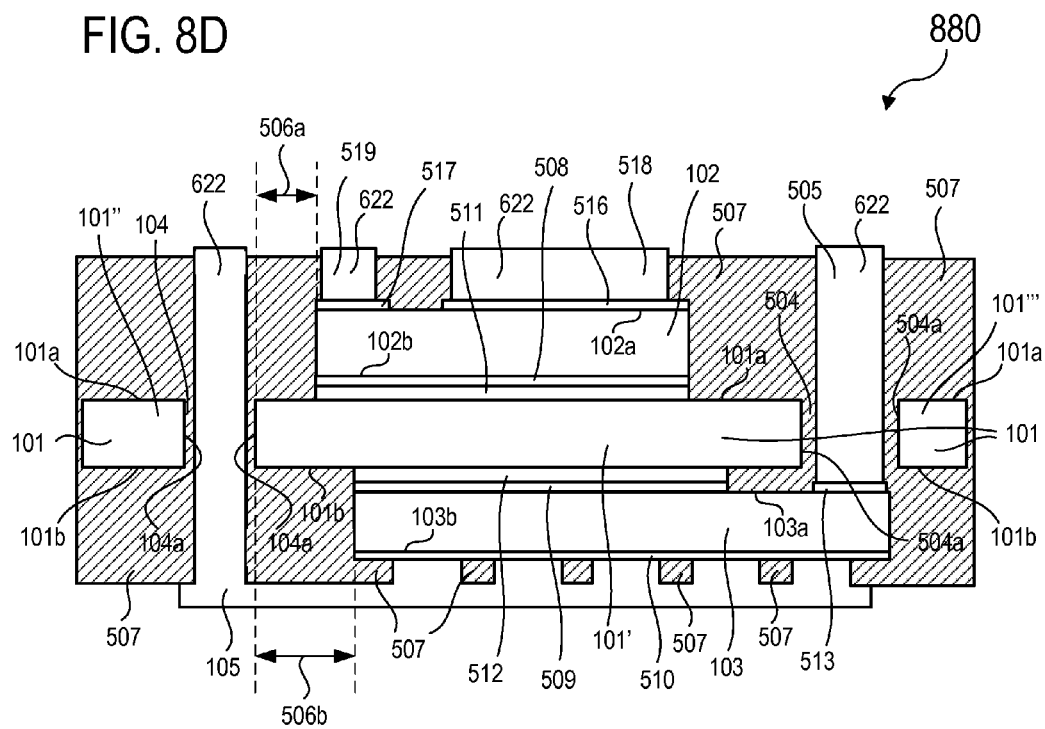

FIG. 8D shows in a fourth cross-sectional view 880 that electrically conductive material 622 is deposited thereby filling the vias 621a, 621b, 621c, 621d, 621e with the electrically conductive material 622 and forming the electrical contact structure 105 that electrically contacts the second die 103's second electrical contact (e.g. drain contact) 510 and the second, third and fourth electrical contact structures 505, 518, 519 that electrically contact the second die 103's third electrical contact (e.g. gate contact) 513, the first die 102's second electrical contact (e.g. source contact) 516 and the first die 102's third electrical contact (e.g. gate contact) 517, respectively. Depositing the electrically conductive material 622 may be achieved in a similar manner as described above in connection with FIG. 6D.

The structure shown in FIG. 8D corresponds to the die arrangement 700 shown in FIG. 7. Illustratively, in accordance with an embodiment a drain contact 510 of the second die 103 may be electrically contacted by the electrical contact structure 105 that leads through the opening 104 in the carrier 101 and a gate contact 513 of the second die 103 may be electrically contacted by the second electrical contact structure 505 that leads through the second opening 504 in the carrier 101.

FIG. 9 shows a schematic cross-sectional view of a die arrangement 900 in accordance with an embodiment.

The die arrangement 900 is to some extent similar to the die arrangement 700 shown and described in connection with FIG. 7; parts or elements with the same reference numerals as in FIG. 7 are the same as in FIG. 7 and will not be redescribed here in detail again for the sake of brevity; reference is made to the description above. In the following, emphasis will be placed on the differences between the die arrangements 700 and 900.

The die arrangement 900 is different from the die arrangement 700 of FIG. 7 in that the die arrangement 900 additionally includes a third die 923 disposed over the first side 101a (upper side) of the carrier 101.

As shown, the third die 923 may be disposed over the upper side 101a of the carrier 101 in the third region 101''' of the carrier 101 that may be electrically insulated from the first region 101' of the carrier 101 over which the first die 102 and the second die 103 are disposed.

In accordance with the embodiment shown, the third die 923 includes a first side 923a and a second side 923b opposite the first side 923a. In accordance with the embodiment shown, the first side 923a of the third die 923 is a front side of the third die 923 and the second side 923b of the third die 923 is a back side of the third die 923.

In accordance with the embodiment shown, the third die 923 may be disposed over the upper side 101a of the carrier 101 in such a manner that the back side 923b of the third die 923 faces the upper side 101a of the carrier 101.

In accordance with the embodiment shown, the third die 923 includes an electrical contact 924.

In accordance with the embodiment shown, the electrical contact 924 of the third die 923 may be located on the front side 923a of the third die 923.

In accordance with the embodiment shown, the second electrical contact structure 505, which leads through the second opening 504 and electrically contacts the third electrical contact (e.g. gate contact) 513 of the second die 103, may also electrically contact the electrical contact 924 of the third die 923.

In accordance with the embodiment shown, the electrical contact 924 of the third die 923 may be configured such that an electrical control potential (e.g. a gate control potential) may be provided via the electrical contact 924. Illustratively, in accordance with an embodiment, a gate control potential may be provided by the third die 923 and may be supplied to the third electrical contact (e.g. gate contact) 513 of the second die 103 via the electrical contact 924 of the third die 923 and the additional electrical contact structure 505 electrically connecting the third electrical contact (e.g. gate contact) 513 of the second die 103 with the electrical contact 924 of the third die 923.

In accordance with the embodiment shown, the third die 923 includes a second electrical contact 925 and a third electrical contact 926. In accordance with other embodiments, the third die 923 may include additional electrical contacts.

In accordance with the embodiment shown, the second electrical contact 925 and the third electrical contact 926 of the third die 923 may be located on the front side 923a of the third die 923.

In accordance with an embodiment, the die arrangement 900 may include a fifth electrical contact structure 927 that may be disposed over and electrically contact the second electrical contact 925 of the third die 923, and a sixth electrical contact structure 928 that may be disposed over and electrically contact the third electrical contact 926 of the third die 923, as shown. In accordance with other embodiments, the die arrangement 900 may include additional electrical contact structures that may be disposed over and electrically contact additional electrical contacts of the third die 923.

In accordance with an embodiment, at least one of the first die 102 and the second die 103 may be configured as a power die, including for example at least one power circuit, e.g. a power IC (integrated circuit). Each power circuit may, for example, include one or more power devices, e.g. power transistors, in accordance with an embodiment. The power circuit(s) or power devices of each die 102, 103 may be provided with electrical supply and/or control potentials (e.g. source/drain potentials, gate potential) via the respective electrical contacts of the first die 102 and the second die 103.

In accordance with some embodiments, the power circuit or power circuits of the first die 102 and the second die 103 may be connected with one another via the carrier 101 (illustratively, via the first region 101' of the carrier 101 in accordance with the embodiment shown), and may further be connected with the periphery, for example by means of the electrical contact structure 105, in accordance with an embodiment.

In accordance with an embodiment, the first die 102 may be configured as a low-side device, for example as a low-side transistor (in other words, a transistor whose source contact (source contact 516 of the first die 102) may be coupled to a low electrical supply potential (e.g. VSS or ground potential) and whose drain contact (drain contact 508 of the first die 102) may be coupled to an intermediate node (illustratively, the first region 101' of the carrier 101 may represent the intermediate node in accordance with the embodiment shown), and the second die 103 may be configured as a high-side device, for example as a high-side transistor (in other words, a transistor, whose drain contact (drain contact 510 of the second die 103) may be coupled to a high electrical supply potential (e.g. VDD potential) and whose source contact (source contact 509 of the second die 103) may be coupled to the intermediate node (i.e. first region 101' of the carrier 101)).

In accordance with an embodiment, the third die 923 may be configured as a logic die including, for example, at least one logic circuit, e.g. a logic IC (integrated circuit). The logic circuit may, for example, include one or more logic devices, e.g. logic transistors, in accordance with an embodiment. The logic circuit(s) or logic devices of the third die 923 may, for example, be provided with electrical supply potentials via the second electrical contact 925 and the third electrical contact 926 of the third die 923. In accordance with an embodiment, the logic circuit(s) of the third die 923 may be configured to provide a gate control potential for the second die 103 at the electrical contact 924 of the third die 923 that is coupled to the third electrical contact (gate contact) 513 of the second die 103.

In accordance with an embodiment, the third die 923 may include a fourth electrical contact 929 that may be located on the back side 923b of the third die 923, as shown. In accordance with other embodiments, the third die 923 may include additional electrical contacts located on its back side 923b. In accordance with another embodiment, the fourth electrical contact 929 (and possibly additional electrical contacts) located on the third die 923's back side 923b may be omitted.

In accordance with an embodiment, the third die 923 may be attached to the carrier 101 (for example, to the third region 101''' of the carrier 101 in accordance with the embodiment shown) by means of an adhesive layer 930 disposed between the carrier 101 and the third die 923 (for example, between the carrier 101 and the fourth electrical contact 929, if present). In accordance with an embodiment, the adhesive layer 930 may be an electrically conductive adhesive layer. Alternatively, the adhesive layer 930 may be electrically insulating. In accordance with other embodiments, the third die 923 may be attached to the carrier 101 by means of other suitable methods, for example by means of soldering.

Figure 10:
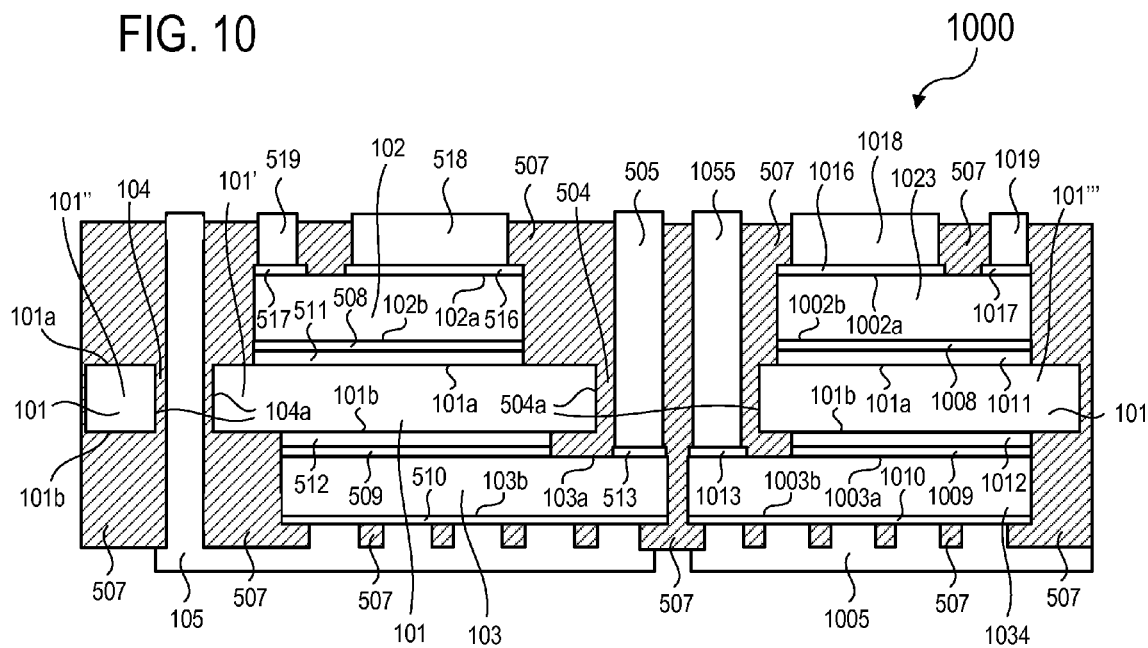
FIG. 10 shows a schematic cross-sectional view of a die arrangement in accordance with an embodiment.

FIG. 10 shows a schematic cross-sectional view of a die arrangement 1000 in accordance with an embodiment.

The die arrangement 1000 is to some extent similar to the die arrangement 700 shown and described in connection with FIG. 7; parts or elements with the same reference numerals as in FIG. 7 are the same as in FIG. 7 and will not be redescribed here in detail again for the sake of brevity; reference is made to the description above. In the following, emphasis will be placed on the differences between the die arrangements 700 and 1000.

The die arrangement 1000 is different from the die arrangement 700 of FIG. 7 in that the die arrangement 1000 additionally includes a third die 1023 disposed over the upper side 101*a* of the carrier 101 in the third region 101''' of the carrier 101, a fourth die 1034 disposed over the lower side 101*b* of the carrier 101 in the third region 101''' of the carrier 101, and a fifth electrical contact structure 1055 leading through the second opening 504 and electrically contacting the fourth die 1034.

In accordance with the embodiment shown, the third die 1023 and the fourth die 1034 each have a first side 1002*a*, 1003*a* and a second side 1002*b*, 1003*b* opposite the first side 1002*a*, 1003*a*. In accordance with the embodiment shown, the first side 1002*a*, 1003*a* is a front side of the respective die 1023, 1034 and the second side 1002*b*, 1003*b* is a back side of the respective die 1023, 1034. That is, the first side 1002*a* of the third die 1023 is a front side of the third die 1023 and the second side 1002*b* of the third die 1023 is a back side of the third die 1023. Likewise, the first side 1003*a* of the fourth die 1034 is a front side of the fourth die 1034 and the second side 1003*b* of the fourth die 1034 is a back side of the fourth die 1034.

In accordance with the embodiment shown, the third die 1023 is disposed over the first side 101*a* (upper side) of the carrier 101 in such a manner that the second side 1002*b* (back side) of the third die 1023 faces the first side 101*a* (upper side) of the carrier 101, and the fourth die 1034 is disposed over the second side 101*b* (lower side) of the carrier 101 in such a manner that the first side 1003*a* (front side) of the fourth die 1034 faces the second side 101*b* (lower side) of the carrier 101.

In accordance with the embodiment shown, the third die 1023 includes an electrical contact 1008 that is located on the second side 1002*b* (back side) of the third die 1023, and the fourth die 1034 includes a first electrical contact 1009 that is located on the first side 1003*a* (front side) of the fourth die 1034, a second electrical contact 1010 that is located on the second side 1003*b* (back side) of the fourth die 1034, and a third electrical contact 1013 that is located on the first side 1003*a* (front side) of the fourth die 1034.

The third die 1023 is disposed over the first side 101*a* (upper side) of the carrier 101 in such a manner that the electrical contact 1008 of the third die 1023 located on the second side 1002*b* (back side) of the third die 1023 electrically contacts the third region 101''' of the carrier 101, and the fourth die 1034 is disposed over the second side 101*b* (lower side) of the carrier 101 in such a manner that the first electrical contact 1009 of the fourth die 1034 located on the first side 1003*a* (front side) of the fourth die 1034 electrically contacts the third region 101''' of the carrier 101 and the third electrical contact 1013 of the fourth die 1034 located on the first side 1003*a* (front side) of the fourth die 1034 is electrically contacted by the fifth electrical contact structure 1055.

In accordance with the embodiment shown, an electrically conductive layer 1011 is disposed between the third die 1023's electrical contact 1008 and the third region 101''' of the carrier 101. The electrically conductive layer 1011 may serve to attach the third die 1023 to the carrier 101. The electrically conductive layer 1011 may for example include or may be made of an electrically conductive adhesive material (e.g. electrically conductive glue material). In accordance with other embodiments, the third die 1023 may be attached to the carrier 101 using other suitable methods, for example by means of soldering.

Similarly, in accordance with the embodiment shown, an electrically conductive layer 1012 is disposed between the fourth die 1034's first electrical contact 1009 and the third region 101''' of the carrier 101. The electrically conductive layer 1012 may serve to attach the fourth die 1034 to the carrier 101. The electrically conductive layer 1012 may for example include or may be be made of an electrically conductive adhesive material (e.g. electrically conductive glue material). In accordance with other embodiments, the fourth die 1034 may be attached to the carrier 101 using other suitable methods, for example by means of soldering.

Illustratively, the third die 1023's electrical contact 1008 located on the back side 1002*b* of the third die 1023 may be electrically connected with the fourth die 1034's first electrical contact 1009 located on the front side 1003*a* of the fourth die 1034 via the third region 101''' of the carrier 101 disposed in-between. In other words, the third die 1023's electrical contact 1008 on its back side 1002*b* and the fourth die 1034's first electrical contact 1009 on its front side 1003*a* may be electrically connected with one another via the carrier 101, while the fourth die 1034's third electrical contact 1013 located on the front side 1003*a* of the fourth die 1034 may be electrically contacted by the fifth electrical contact structure 1055 leading through the second opening 504 in the carrier 101.

In accordance with the embodiment shown, the electrical contact 1008 of the third die 1023 located on the second side 102*b* (back side) of the third die 1023 may be a drain contact of the third die 1023, the first electrical contact 1009 of the fourth die 1034 located on the first side 1003*a* (front side) of the fourth die 1034 may be a source contact of the fourth die 1034, the second electrical contact 1010 of the fourth die 1034 located on the second side 1003*b* (back side) of the fourth die 1034 may be a drain contact of the fourth die 1034, and the third electrical contact 1013 of the fourth die 1034 located on the first side 1003*a* (front side) of the fourth die 1034 may be a gate contact of the fourth die.

Illustratively, a drain contact 1008 of the third die 1023 may electrically contact the first side 101*a* (upper side) of the carrier 101 in the third region 101''' while a source contact 1009 of the fourth die 1034 may electrically contact the second side 101*b* (lower side) of the carrier 101 and a gate contact 1013 of the fourth die 1034 may be electrically contacted by the fifth electrical contact structure 1055 leading through the second opening 504 in the carrier 101.

In accordance with the embodiment shown, the second electrical contact 1010 of the fourth die 1034 that is located on the second side 1003*b* (back side) of the fourth die 1034 may be electrically contacted by a sixth electrical contact structure 1005. In accordance with an embodiment, the sixth electrical contact structure 1005 may lead through a third opening in the carrier 101 (not shown) to the upper side of the arrangement, for example in a similar manner as the electrical contact structure 105 leading through the opening 104. The third opening may, for example, be located proximate (near) the third die 1023 and/or fourth die 1034 and may be configured in a similar manner as the opening 104, in accordance with an embodiment.

In accordance with the embodiment shown, the third electrical contact 1013 of the fourth die 1034 may be a gate contact of the fourth die 1034.

In accordance with the embodiment shown, the third die 1023 may include a second electrical contact 1016 that may be located on the first side 1002*a* (upper side) of the third die 1023. In accordance with the embodiment shown, the second electrical contact 1016 of the third die 1023 may be a source contact of the third die 1023.

In accordance with the embodiment shown, the third die 1023 may include a third electrical contact 1017 that may be located on the first side 1002*a* (upper side) of the third die 1023. In accordance with the embodiment shown, the third electrical contact 1017 of the third die 1023 may be a gate contact of the third die 1023.

In accordance with the embodiment shown, the die arrangement 1000 may further include a seventh electrical contact structure 1018 that may be disposed over and electrically contact the second electrical contact 1016 of the third die 1023.

In accordance with the embodiment shown, the die arrangement 1000 may further include an eighth electrical contact structure 1019 that may be disposed over and electrically contact the third electrical contact 1017 of the third die 1023.

In accordance with an embodiment, at least one of the electrical contact structures 1005, 1018, 1019, 1055 may include or may be made of an electrically conductive material, e.g. a metal such as, for example copper (Cu). In accordance with other embodiments, at least one of the electrical contact structures 1005, 1018, 1019, 1055 may include or may be made of other electrically conductive materials.

The electrical contact structures 1005, 1018, 1019, 1055 may be electrically insulated from one another and/or from other electrical contact structures, for example by means of the electrically insulating layer 507, as shown.

In accordance with an embodiment, the third die 1023 may be configured in a similar manner as the first die 102, for example as a power die including one or more power devices in accordance with an embodiment. Similarly, the fourth die 1034 may be configured in a similar manner as the second die 103 in accordance with an embodiment, for example as a power die including one or more power devices in accordance with an embodiment.

For example, in accordance with an embodiment, at least one of the third die 1023 and the fourth die 1034 may include at least one power circuit, e.g. a power IC (integrated circuit). The power circuit may, for example, include one or more power devices, e.g. power transistors, in accordance with an embodiment. The power circuit(s) or power devices of each of the third die 1023 and the fourth die 1034 may be provided with electrical supply and/or control potentials (e.g. source/drain potentials, gate potential) via the respective electrical contacts of the third die 1023 and the fourth die 1034. For example, a drain potential (e.g. VDD) may be supplied to the drain contact 1010 of the fourth die 1034 via the sixth electrical contact structure 1005, a source potential (e.g. VSS) may be supplied to the source contact 1016 of the third die 1023 via the seventh electrical contact structure 1018, a first gate potential may be supplied to the gate contact 1017 of the third die 1023 via the eighth electrical contact structure 1019, and a second gate potential may be supplied to the gate contact 1013 of the fourth die 1034 via the fifth electrical contact structure 1055 leading through the second opening 504.

Illustratively, FIG. 10 shows a die arrangement 1000 where gate contacts 513, 1013 of two different dies 103, 1034 disposed over the lower side 101b of the carrier 101 are electrically contacted by two respective electrical contact structures 505, 1055 leading through a common opening 504 in the carrier 101. In other words, the second electrical contact structure 505 and the fifth electrical contact structure 1055 lead through the same opening (i.e. second opening 504).

FIG. 11 shows a schematic cross-sectional view of a die arrangement 1100 in accordance with another embodiment.

The die arrangement 1100 may include a carrier 101 having a first side 101a and a second side 101b opposite the first side 101a. The carrier 101 may include a first region 101' and a second region 101" that is electrically insulated from the first region 101'. The die arrangement 1100 may further include a first die 102 disposed over the first side 101a of the carrier 101 in the first region 101' of the carrier 101 and electrically contacting the first region 101' of the carrier 101. The die arrangement 1100 may further include a second die 103 disposed over the second side 101b of the carrier 101 in the first region 101' of the carrier 101 and electrically contacting the first region 101' of the carrier 101. The die arrangement 1100 may further include an electrical contact structure 105 that leads from the first side 101a of the carrier 101 to the second side 101b of the carrier 101 via the second region 101" of the carrier 101 and electrically contacts the second die 103.

The carrier 101 may be configured as a thin metal strip, for example as a lead frame, having, for example a thickness in accordance with one of the embodiments described herein.

The first side 101a of the carrier 101 may be an upper side of the carrier 101 and the second side 101b of the carrier 101 may be a lower side of the carrier 101.

The first die 102 and the second die 103 may be electrically connected with one another via the first region 101' of the carrier 101. Thus, electrical current may flow from the first die 102 towards the second die 103 (or vice versa) via the first region 101' of the carrier 101.

The die arrangement 1100 may include an opening 104 in the carrier 101 leading from the first side (e.g. upper side) 101a of the carrier 101 to the second side (e.g. lower side) 101b of the carrier 101. The opening 104 may be located between the first region 101' of the carrier 101 and the second region 101" of the carrier 101. The opening 104 may be laterally spaced apart from the first die 102 and the second die 103.

Illustratively, the second region 101" of the carrier 101 may be laterally spaced apart from the first region 101' of the carrier 101 by the opening 104. The opening 104 may include side walls 104a that may illustratively be formed by the carrier 101 (e.g. by the first region 101' and the second region 101" of the carrier 101), as shown.

The second region 101" of the carrier 101 may be electrically insulated from the first region 101' of the carrier 101.

The second region 101" of the carrier 101 may be electrically insulated from the first region 101' of the carrier 101 and from at least one other region of the carrier 101. For example, the second region 101" of the carrier 101 may be electrically insulated from the remaining regions or parts of the carrier 101 (in other words, from the rest of the carrier 101). Illustratively, the second region 101" of the carrier 101 may be configured as an insulated "isle" of the carrier 101 in accordance with an embodiment.

The second region 101" of the carrier 101 may be located laterally proximate (in other words, close to or near) the first region 101' of the carrier 101. For example, a lateral distance 206 between the second region 101" of the carrier 101 and the first region 101' of the carrier 101 may be in accordance with one or more embodiments described herein. The lateral distance 206 between the first and second regions 101', 101" of the carrier 101 may correspond to a diameter of the opening 104, as shown.

An electrically insulating layer 507 may be disposed in the opening 104 between the first region 101' and the second region 101" of the carrier 101, as shown.

A lateral cross-section of the opening 104 may have an arbitrary shape, for example a circular shape, an elliptical shape, a rectangular shape, a quadratic shape, or a polygonal shape in accordance with some embodiments, or any other shape in accordance with other embodiments.

The electrical contact structure 105 may include or may be made of electrically conductive material.

The electrical contact structure 105 may include a first portion 105' disposed over and electrically contacting the first side (upper side) 101a of the carrier 101 in the second region 101" of the carrier 101, and a second portion 105" disposed over and electrically contacting the second side (lower side) 101b of the carrier 101 in the second region 101" of the carrier 101, as shown. The second portion 105" of the electrical contact structure 105 may further be in contact with the second die 103, as shown.

Illustratively, the first portion 105' of the electrical contact structure 105 and the second portion 105" may be electrically connected with one another via the second region 101" of the carrier 101. In other words, the second region 101" of the carrier may form an intermediate portion of the electrical contact structure 105. Thus, electrical current may flow from the first portion 105' of the electrical contact structure 105 towards the second portion 105" of the electrical contact structure 105 (or vice versa) via the second region 101" of the carrier 101.

The first die 102 may have a first side 102a and a second side 102b opposite the first side 102a, as shown. The second die 103 may have a first side 103a and a second side 103b opposite the first side 103a, as shown.

The first side 102a of the first die 102 may be a front side of the first die 102 and the second side 102b of the first die 102 may be a back side of the first die 102. The first side 103a of the second die 103 may be a front side of the second die 103 and the second side 103b of the second die 103 may be a back side of the second die 103.

The first die 102 may be disposed over the first side (upper side) 101a of the carrier 101 in such a manner that the second side (back side) 102b of the first die 102 faces the first side (upper side) 101a of the carrier 101, and the second die 103 may be disposed over the second side 101b (lower side) of the carrier 101 in such a manner that the first side (front side) 103a of the second die 103 faces the second side (lower side) 101b of the carrier 101, as shown.

The first die 102 may include at least one electrical contact 516, 517 (e.g. pad or metallization) located on the first side (front side) 102a of the first die 102 and at least one electrical contact 508 (e.g. pad or metallization) located on the second side (back side) 102b of the first die 102, as shown.

The second die 103 may include at least one electrical contact 509, 513 (e.g. pad or metallization) located on the first side (front side) 103a of the second die 103 and at least one electrical contact 510 (e.g. pad or metallization) located on the second side (back side) 103b of the second die 103, as shown.

The first die 102 may include an electrical contact 508 located on the second side (back side) 102b of the first die 102, and the second die 103 may include a first electrical contact 509 located on the first side (front side) 103a of the second die 103 and a second electrical contact 510 located on the second side (back side) 103b of the second die 103, as shown.

The first die 102 may be disposed over the first side (upper side) 101a of the carrier 101 in the first region 101' of the carrier 101 in such a manner that the electrical contact 508 of the first die 102 located on the second side (back side) 102b of the first die 102 electrically contacts the first region 101' of the carrier 101, and the second die 103 may be disposed over the second side (lower side) 101b of the carrier 101 in the first region 101' of the carrier 101 in such a manner that the first electrical contact 509 of the second die 103 located on the first side (front side) 103a of the second die 103 electrically contacts the first region 101' of the carrier 101 and the second electrical contact 510 of the second die 103 located on the second side (back side) 103b of the second die 103 is electrically contacted by the electrical contact structure 105 leading via the second region 101" of the carrier 101, as shown.

The first die 102's electrical contact 508 located on the second side (back side) 102b of the first die 102 may be electrically connected with the second die 103's first electrical contact 509 located on the first side (front side) 103a of the second die 103 via the first region 101' of the carrier 101 disposed in-between, as shown.

Illustratively, a back side electrical contact (e.g. pad or metallization) 508 and a front side electrical contact (e.g. pad or metallization) 509 of two dies 102, 103 located on opposite sides 101a, 101b of a carrier 101 may be electrically connected with one another via a first region 101' of the carrier 101, while a back side electrical contact (e.g. pad or metallization) 510 of one die 103 of the two dies 102, 103 may be electrically connected by an electrical contact structure 105 leading via a second region 101" of the carrier 101 that is electrically insulated from the first region 101' of the carrier 101, as shown.

An electrically conductive layer 511 may be disposed between the first die 102's electrical contact 508 and the first region 101' of the carrier 101, as shown. The electrically conductive layer 511 may serve to attach the first die 102 to the first region 101' of the carrier 101. The electrically conductive layer 511 may for example include or may be made of an electrically conductive adhesive material (e.g. electrically conductive glue material). In accordance with other embodiments, the first die 102 may be attached to the carrier 101 using other suitable methods, for example by means of soldering.

A second electrically conductive layer 512 may be disposed between the second die 103's first electrical contact 509 and the first region 101' of the carrier 101, as shown. The second electrically conductive layer 512 may serve to attach the second die 103 to the first region 101' of the carrier 101. The second electrically conductive layer 512 may for example include or may be made of an electrically conductive adhesive material (e.g. electrically conductive glue material). In accordance with other embodiments, the second die 103 may be attached to the carrier 101 using other suitable methods, for example by means of soldering.

The electrical contact 508 of the first die 102 located on the second side (back side) 102b of the first die 102 may be configured as a source/drain contact of the first die 102, the first electrical contact 509 of the second die 103 located on the first side (front side) 103a of the second die 103 may be configured as a first source/drain contact of the second die 103 and the second electrical contact 510 of the second die 103 located on the second side (back side) 103b of the second die 103 may be configured as a second source/drain contact of the second die 103.

The electrical contact 508 of the first die 102 located on the second side (back side) 102b of the first die 102 may be configured as a drain contact of the first die 102. The first electrical contact 509 of the second die 103 located on the first side (front side) 103a of the second die 103 may be configured as a source contact of the second die 103, and the second electrical contact 510 of the second die 103 located on the second side (back side) 103b of the second die 103 may be configured as a drain contact of the second die 103.

A source/drain contact (e.g. drain contact) 508 of the first die 102 located on the first die 102's second side (back side) 102b may electrically contact the first side (upper side) 101a of the carrier 101 in the first region 101' of the carrier 101 while a first source/drain contact (e.g. source contact) 509 of the second die 103 located on the second die 103's first side (front side) 103a may electrically contact the second side (lower side) 101b of the carrier 101 in the first region 101' of the carrier 101 and a second source/drain contact (e.g. drain contact) 510 of the second die 103 located on the second die 103's second side (back side) 103b may be electrically contacted by the electrical contact structure 105 leading via the second region 101" of the carrier 101, as shown.

Illustratively, a back side drain contact (e.g. pad or metallization) 508 and a front side source contact (e.g. pad or metallization) 509 of two dies 102, 103 located on opposite sides 101a, 101b of a carrier 101 may be electrically connected with one another via a first region 101' of the carrier 101, while a back side drain contact (e.g. pad or metallization) 510 of one die 103 of the two dies 102, 103 may be electrically contacted by an electrical contact structure 105 leading via a second region 101" of the carrier 101 that is electrically insulated from the first region 101' of the carrier 101, as shown.

The third region 101''' of the carrier 101 may be located laterally proximate (in other words, close to or near) the first region 101' of the carrier 101. For example, a lateral distance between the third region 101''' and the first region 101' of the carrier 101 may have a similar value as the lateral distance 206 between the second region 101" and the first region 101' of the carrier 101.

The third region 101''' of the carrier 101 may be electrically insulated from the first region 101' of the carrier 101 and from at least one other region of the carrier 101, for example the second region 101" of the carrier 101. The third region 101''' of the carrier 101 may be electrically insulated from the remaining regions or parts of the carrier 101 (in other words, from the rest of the carrier 101). Illustratively, the third region 101''' of the carrier 101 may be configured as an insulated "isle" of the carrier 101.

The second die 103 may include a third electrical contact 513 that may be located on the first side (front side) 103a of the second die 103, as shown.

The third electrical contact 513 of the second die 103 may be configured as a gate contact of the second die 103.

The die arrangement 1100 may include a second electrical contact structure 505 that may electrically contact the third electrical contact 513 of the second die 103, as shown. The second electrical contact structure 505 may include or may be made of electrically conductive material.

The second electrical contact structure 505 may be disposed over the first side (upper side) 101a of the carrier 101 in the third region 101''' of the carrier 101 and may electrically contact the third region 101''' of the carrier 101, and the third electrical contact (e.g. gate contact) 513 of the second die 103 may be disposed over the second side (lower side) 101b of the carrier 101 in the third region 101''' of the carrier 101 and may electrically contact the third region 101''' of the carrier 101, as shown. Illustratively, the third electrical contact (e.g. gate contact) 513 of the second die 103 may be electrically contacted by the second electrical contact structure 505 via the third region 101''' of the carrier 101, as shown.

The die arrangement 1100 may include a second opening 504 in the carrier 101 leading from the first side (upper side) 101a of the carrier 101 to the second side (lower side) 101b of the carrier 101, as shown. The second opening 504 may be located between the first region 101' and the third region 101''' of the carrier 101, as shown The second opening 504 may include side walls 504a that may illustratively be formed by the carrier 101 (e.g. by the first region 101' and the third region 101''' of the carrier 101), as shown.

The second opening 504 may further be configured and/or formed in a similar manner as the opening 104 in the carrier 101, for example in accordance with one or more embodiments described herein in connection with the opening 104.

The opening 104 and the second opening 504 may be laterally arranged at opposite sides (or ends) of the first region 101' of the carrier 101, as shown.

The third region of the carrier 101 may be electrically insulated from the first region 101' (and possibly additional regions) of the carrier 101 by means of the second opening 504 and an electrically insulating layer 507 disposed at least in the second opening 504, as shown.

The second electrical contact structure 505 may include or may be made of similar materials as the electrical contact structure 105.

A third electrically conductive layer 514 may be disposed between the second die 103's third electrical contact (e.g. gate contact) 513 and the third region 101''' of the carrier 101. The electrically conductive layer 514 may serve to attach the third electrical contact (e.g. gate contact) 513 of the second die 103 to the third region 101''' of the carrier 101. The electrically conductive layer 514 may for example include or may be made of an electrically conductive adhesive material (e.g. electrically conductive glue material). In accordance with other embodiments, the third electrical contact (e.g. gate contact) 513 of the second die 103 may be attached to the third region 101''' of the carrier 101 using other suitable methods, for example by means of soldering.

The first die 102 may include a second electrical contact 516 located on the first side (front side) 102a of the first die 102, as shown. The second electrical contact 516 of the first die 102 may be configured as a second source/drain contact of the first die 102, for example as a source contact of the first die 102.

The first die 102 may include a third electrical contact 517 located on the first side (front side) 102a of the first die 102, as shown. The third electrical contact 517 of the first die 102 may be configured as a gate contact of the first die 102.

The die arrangement 1100 may include a third electrical contact structure 518 that may be disposed over and electrically contact the second electrical contact (e.g. source contact) 516 of the first die 102, as shown. The third electrical contact structure 518 may include or may be made of similar materials as the electrical contact structure 105 and/or the second electrical contact structure 505.

The die arrangement 1100 may include a fourth electrical contact structure 519 that may be disposed over and electrically contact the third electrical contact (e.g. gate contact) 517 of the first die 102, as shown. The fourth electrical contact structure 519 may include or may be made of similar materials as the electrical contact structure 105 and/or the second electrical contact structure 505 and/or the third electrical contact structure 518.

Each of the first die 102 and the second die 103 may be configured as a power die (or power chip). For example, the first die 102 and the second die 103 may include at least one power circuit, e.g. a power IC (integrated circuit). The power circuit(s) may, for example, include one or more power devices, e.g. power transistors. The power circuit(s) or power device(s) of each die 102, 103 may be provided with electrical supply and/or control potentials (e.g. source/drain potentials, gate potential) via respective electrical contacts of the first die 102 and the second die 103.

The first die 102 may be configured as or may include a low-side device, for example a low-side transistor (illustratively, a transistor whose source contact 516 may be coupled to a low electrical supply potential (e.g. VSS or ground potential) and whose drain contact 508 may be coupled to an intermediate node), and the second die 103 may be configured as or may include a high-side device, for example a high-side transistor (illustratively, a transistor whose drain contact 510 may be coupled to a high electrical supply potential (e.g. VDD potential) and whose source contact 509 may be coupled to the intermediate node).

FIG. 12 shows a schematic cross-sectional view of a die arrangement 1200 in accordance with an embodiment.

The die arrangement 1200 is to some extent similar to the die arrangement 1100 shown and described in connection with FIG. 11; parts or elements with the same reference numerals as in FIG. 11 are the same as in FIG. 11 and will not be redescribed here in detail again for the sake of brevity; reference is made to the description above. In the following, emphasis will be placed on the differences between the die arrangements 1100 and 1200.

The die arrangement 1200 is different from the die arrangement 1200 of FIG. 11 in that the third electrical contact (e.g. gate contact) 513 of the second die 103 is located directly below the second opening 504 in the carrier 101 and the second electrical contact structure 505 leads through the second opening 504 and contacts the third electrical contact (e.g. gate contact) 513 of the second die 103. Illustratively, the second electrical contact structure 505 may be disposed on the third electrical contact (e.g. gate contact) 513 of the second die 103 without the third region 101′′′ of the carrier 101 being in-between (as is the case in the die arrangement 1100 of FIG. 11). The second electrical contact structure 505 may be electrically insulated from the side walls 504*a* of the second opening 504 by means of the electrically insulating layer 507 disposed between the second electrical contact structure 505 and the side walls 504*a*.

FIG. 13 shows a schematic cross-sectional view of a die arrangement 1300 in accordance with an embodiment.

The die arrangement 1300 is to some extent similar to the die arrangement 1300 shown and described in connection with FIG. 7; parts or elements with the same reference numerals as in FIG. 7 are the same as in FIG. 7 and will not be redescribed here in detail again for the sake of brevity; reference is made to the description above. In the following, emphasis will be placed on the differences between the die arrangements 700 and 1300.

The die arrangement 1300 is different from the die arrangement 700 of FIG. 7 in that the second die 103 is disposed over the second side (lower side) 101*b* of the carrier 101 in such a manner that the second side (back side) 103*b* of the second die 103 faces the second side (lower side) 101*b* of the carrier 101.

As shown, the first die 102 may be disposed over the first side (upper side) 101*a* of the carrier 101 in such a manner that the electrical contact 508 of the first die 102 located on the second side (back side) 102*b* of the first die 102 electrically contacts the first region 101′ of the carrier 101, and the second die 103 may be disposed over the second side (lower side) 101*b* of the carrier 101 in such a manner that the second electrical contact 510 of the second die 103 located on the second side (back side) 103*b* of the second die 103 electrically contacts the first region 101′ of the carrier 101 and the first electrical contact 509 of the second die 103 located on the first side (front side) 103*a* of the second die 103 is electrically contacted by the electrical contact structure 105.

Thus, in accordance with the embodiment shown, the first die 102's electrical contact 508 located on the second side (back side) 102*b* of the first die 102 may be electrically connected with the second die 103's second electrical contact 510 located on the second side (back side) 103*b* of the second die 103 via the first region 101′ of the carrier 101 disposed in-between.

Illustratively, in accordance with the embodiment shown, back side electrical contacts (e.g. pads or metallizations) 508, 510 of the first and second dies 102, 103 located on opposite sides 101*a*, 101*b* of the carrier 101 may be electrically connected with one another via the carrier 101, while a front side electrical contact (e.g. pad or metallization) 509 of the second die 103 may be electrically contacted by the electrical contact structure 105 leading through the opening 104 in the carrier 101.

The electrical contact 508 of the first die 102 may be configured as a source/drain contact (e.g. as a drain contact) of the first die 102, the first electrical contact 509 of the second die 103 may be configured as a first source/drain contact (e.g. as a source contact) of the second die 103 and the second electrical contact 510 of the second die 103 may be configured as a second source/drain contact (e.g. as a drain contact) of the second die 103.

Illustratively, in accordance with an embodiment, back side drain contacts (e.g. pads or metallizations) 508, 510 of two dies 102, 103 located on opposite sides 101*a*, 101*b* of a carrier 101 may be electrically connected with one another via the carrier 101, while a front side source contact (e.g. pad or metallization) 509 of one die 103 of the two dies 102, 103 may be electrically contacted by an electrical contact structure 105 leading through an opening 104 in the carrier 101.

In addition, a third electrical contact 513 of the second die 103 located on the first side (front side) 103*a* of the second die 103 may be electrically contacted by a second electrical contact structure 505 leading through a second opening 504 in the carrier 101. The third electrical contact 513 of the second die 103 may, for example, be configured as a gate contact of the second die 103.

A second electrical contact 516 and a third electrical contact 517 of the first die 102 may be configured, respectively, as a second source/drain contact (e.g. as a source contact) and as a gate contact of the first die 102.

Illustratively, FIG. 13 shows a die arrangement 1300, where front side electrical contacts (first electrical contact 509 and third electrical contact 513) of a die 103 that is disposed over a lower side of a carrier 101 (with the die 103's back side 103*b* facing the carrier 101) are electrically contacted by respective electrical contact structures 105 and 505 leading through respective openings 104 and 504 in the carrier 101.

It will be understood that in accordance with an alternative embodiment, the arrangement of the second die 103's first and third electrical contacts 509, 513 may be exchanged. That is, the source contact 509 of the second die 103 may be contacted by the second electrical contact structure 505 while the gate contact 513 may be contacted by the electrical contact structure 105 in accordance with an embodiment.

FIG. 14 shows a schematic cross-sectional view of a die arrangement 1400 in accordance with an embodiment.

The die arrangement 1400 is to some extent similar to the die arrangement 1300 shown and described in connection with FIG. 13; parts or elements with the same reference numerals as in FIG. 13 are the same as in FIG. 13 and will not be redescribed here in detail again for the sake of brevity; reference is made to the description above. In the following, emphasis will be placed on the differences between the die arrangements 1300 and 1400.

The die arrangement 1400 is different from the die arrangement 1300 of FIG. 13 in that the second electrical contact structure 505 leads via the third region 101′′′ of the carrier 101 that is electrically insulated from the first region 101′ of the carrier 101.

As shown, the second electrical contact structure 505 may include a first portion 505′ disposed over and electrically contacting the first side (upper side) 101*a* of the carrier 101 in the third region 101′′′ of the carrier 101, and a second portion 505" disposed over and electrically contacting the second side (lower side) 101b of the carrier 101 in the third region 101''' of the carrier 101.

Illustratively, a first portion 505' of the second electrical contact structure 505 and a second portion 505" of the second electrical contact structure 505 may be electrically connected with one another via the third region 101''' of the carrier 101. In other words, the third region 101''' of the carrier 101 may form an intermediate portion of the second electrical contact structure 505 in accordance with this embodiment. Thus, the die arrangement 1400 may be configured such that electrical current may flow from the first portion 505' of the second electrical contact structure 505 towards the second portion 505" of the second electrical contact structure (or vice versa) via the third region 101''' of the carrier 101.

The second portion 505" of the second electrical contact structure 505 may be in contact with the third electrical contact (e.g. gate contact) 513 of the second die 103, as shown.

Illustratively, FIG. 14 shows a die arrangement 1400, where front side electrical contacts (first electrical contact 509 and third electrical contact 513) of a die 103 that is disposed over a lower side of a carrier 101 (with the die 103's back side 103b facing the carrier 101) are electrically contacted by respective electrical contact structures 105 and 505, with one electrical contact structure 105 of the electrical contact structures 105, 505 leading through an opening 104 in the carrier 101 and another electrical contact structure 505 of the electrical contact structures 105, 505 leading via a region 101''' of the carrier 101 that is electrically insulated from a region 101' over which the die 103 is disposed. In accordance with some embodiments, the electrically insulated region 101''' of the carrier 101 may be an insulated "isle" of the carrier 101.

It will be understood that in accordance with an alternative embodiment, the arrangement of the second die 103's first and third electrical contacts 509, 513 may be exchanged. That is, the first electrical contact (source contact) 509 of the second die 103 may be contacted by the second electrical contact structure 505 while the third electrical contact (gate contact) 513 may be contacted by the electrical contact structure 105 in accordance with an embodiment.

FIG. 15 shows a schematic cross-sectional view of a die arrangement 1500 in accordance with an embodiment.

The die arrangement 1500 is to some extent similar to the die arrangement 1100 shown and described in connection with FIG. 11; parts or elements with the same reference numerals as in FIG. 11 are the same as in FIG. 11 and will not be redescribed here in detail again for the sake of brevity; reference is made to the description above. In the following, emphasis will be placed on the differences between the die arrangements 1100 and 1500.

The die arrangement 1500 is different from the die arrangement 1100 of FIG. 11 in that the second die 103 is disposed over the second side (lower side) 101b of the carrier 101 in such a manner that the second side (back side) 103b of the second die 103 faces the second side (lower side) 101b of the carrier 101.

As shown, the first die 102 may be disposed over the first side (upper side) 101a of the carrier 101 in such a manner that the second side (back side) 102b of the first die 102 faces the first side (upper side) 101a of the carrier 101, and the second die 103 may be disposed over the second side (lower side) 101b of the carrier 101 in such a manner that the second side (back side) 103b of the second die 103 faces the second side (lower side) 101b of the carrier 101.

The first die 102 may be disposed over the first side (upper side) 101a of the carrier 101 in the first region 101' of the carrier 101 in such a manner that the electrical contact 508 of the first die 102 located on the second side (back side) 102b of the first die 102 electrically contacts the first region 101' of the carrier 101, and the second die 103 may be disposed over the second side (lower side) 101b of the carrier 101 in the first region 101' of the carrier 101 in such a manner that the second electrical contact 510 of the second die 103 located on the second side (back side) 103b of the second die 103 electrically contacts the first region 101' of the carrier 101 and the first electrical contact 509 of the second die 103 located on the first side (front side) 103a of the second die 103 is electrically contacted by the electrical contact structure 105 leading via the second region 101" of the carrier 101.

Thus, in accordance with the embodiment shown, the first die 102's electrical contact 508 located on the second side (back side) 102b of the first die 102 may be electrically connected with the second die 103's second electrical contact 510 located on the second side (back side) 103b of the second die 103 via the first region 101' of the carrier 101 disposed in-between.

Illustratively, in accordance with the embodiment shown, back side electrical contacts (e.g. pads or metallizations) 508, 510 of the first and second dies 102, 103 located on opposite sides 101a, 101b of the carrier 101 may be electrically connected with one another via the first region 101' of the carrier 101, while a front side electrical contact (e.g. pad or metallization) 509 of the second die 103 may be electrically contacted by an electrical contact structure 105 leading via the second region 101" of the carrier 101 that is electrically insulated from the first region 101' of the carrier 101

The electrical contact 508 of the first die 102 may be configured as a source/drain contact (e.g. as a drain contact) of the first die 102, the first electrical contact 509 of the second die 103 may be configured as a first source/drain contact (e.g. as a source contact) of the second die 103 and the second electrical contact 510 of the second die 103 may be configured as a second source/drain contact (e.g. as a drain contact) of the second die 103.

Illustratively, in accordance with an embodiment, back side drain contacts (e.g. pads or metallizations) 508, 510 of the first and second dies 102, 103 located on opposite sides 101a, 101b of the carrier 101 may be electrically connected with one another via the first region 101' of the carrier 101, while a front side source contact (e.g. pad or metallization) 509 of the second die 103 may be electrically contacted by an electrical contact structure 105 leading via the second region 101" of the carrier 101 that is electrically insulated from the first region 101' of the carrier 101. The second region 101" of the carrier 101 may, for example, be configured as an insulated "isle" of the carrier 101.

In addition, a third electrical contact 513 of the second die 103 located on the first side (front side) 103a of the second die 103 may be electrically contacted by a second electrical contact structure 505 leading via a third region 101''' of the carrier 101 that is electrically insulated from the first region 101' of the carrier 101. The third region 101''' of the carrier 101 may, for example, be configured as an insulated "isle" of the carrier 101.

The third electrical contact 513 of the second die 103 may, for example, be configured as a gate contact of the second die 103.

A second electrical contact 516 and a third electrical contact 517 of the first die 102 may be configured, respectively, as a second source/drain contact (e.g. as a source contact) and as a gate contact of the first die 102.

Illustratively, FIG. 15 shows a die arrangement 1500, where front side electrical contacts (first electrical contact 509 and third electrical contact 513) of a die 103 that is disposed over a lower side of a carrier 101 (with the die 103's back side 103b facing the carrier 101) are electrically contacted by respective electrical contact structures 105 and 505 leading from an upper side of the carrier 101 to the lower side of the carrier 101 via respective electrically insulated regions 101" and 101'" (e.g. electrically insulated "isles") of the carrier 101.

As shown, the electrical contact structure 105 may include a first portion 105' disposed over and electrically contacting the first side (e.g. upper side) 101a of the carrier 101 in the second region 101" of the carrier 101, and a second portion 105" disposed over and electrically contacting the second side (e.g. lower side) 101b of the carrier 101 in the second region 101" of the carrier 101. The second portion 105" of the electrical contact structure 105 may be in contact with the first electrical contact (e.g. source contact) 509 of the second die 103.

Similarly, the second electrical contact structure 505 may include a first portion 505' disposed over and electrically contacting the first side (e.g. upper side) 101a of the carrier 101 in the third region 101'" of the carrier 101, and a second portion 505"disposed over and electrically contacting the second side (e.g. lower side) 101b of the carrier 101 in the third region 101'" of the carrier 101. The second portion 505" of the second electrical contact structure 505 may be in contact with the third electrical contact (e.g. gate contact) 513 of the second die 103.

It will be understood that in accordance with an alternative embodiment, the arrangement of the second die 103's first and third electrical contacts 509, 513 may be exchanged. That is, the first electrical contact (source contact) 509 of the second die 103 may be contacted by the second electrical contact structure 505 while the third electrical contact (gate contact) 513 may be contacted by the electrical contact structure 105 in accordance with an embodiment.

Die arrangements in accordance with embodiments described herein may be combined to form a multi-chip module.

A multi-chip module in accordance with an embodiment may, for example, include a die arrangement in accordance with one or more embodiments described herein, and at least one additional die arrangement in accordance with one or more embodiments described herein. The die arrangement and the at least one additional die arrangement may be electrically connected with one another and/or with other die arrangements and/or with the periphery by means of the respective electrical contact structures of the die arrangements, in accordance with an embodiment.

In accordance with an embodiment, the at least one additional die arrangement may be disposed over the die arrangement. In other words, a carrier of the at least one additional die arrangement may be disposed over or above a carrier of the die arrangement. Illustratively, the die arrangement and the at least one additional die arrangement may be stacked in accordance with an embodiment.

In accordance with an embodiment, a multi-chip module may include two or more (e.g. three, four, five, . . . , in general an arbitrary number of) die arrangements that may be stacked.

In accordance with an embodiment, the multi-chip module may include a package. The die arrangement and the at least one additional die arrangement may be arranged in the package.

In the following, certain features, aspects and effects of exemplary embodiments are described.

In accordance with some embodiments, die arrangements and manufacturing methods are provided that may allow for an efficient and/or compact (in other words, space-saving) connection of several dies or chips in a single package ("multi-chip connection").

In accordance with some embodiments, a carrier (for example a metal strip, e.g. a lead frame) with one or more openings may be used, where semiconductor circuits (e.g. dies or chips) may be mounted on both sides of the carrier. Thus, additional chip contacts, for example gate contacts in accordance with an embodiment, may be realized via or through the opening(s) of the carrier.

In accordance with some embodiments, die arrangements are provided where on both sides of a carrier (for example, a metal strip, e.g. a lead frame), which may include one or more openings (e.g. holes), dies (chips) may be contacted in such a manner that on the one side of the carrier the dies are contacted to the carrier with their drain contact and on the opposite side of the carrier the dies are contacted to the carrier with their source contact. In accordance with some embodiments, the gate contacts of those dies (chips) that are connected to the carrier via their source contacts may be disposed proximate or directly over the opening(s) of the carrier and thus may be connected to the periphery in further processing steps.

Various embodiments may allow for a multi-chip connection with reduced number of wiring or rewiring levels used to connect several chips in a package.

Furthermore, various embodiments may allow for a multi-chip connection with reduced number of contacting steps used to connect the chips. Thus, various embodiments may, for example, allow for an easy chip assembly.

Furthermore, various embodiments may allow for a multi-chip connection with reduced area and/or space consumption. Thus, various embodiments may, for example, allow for a high device integration level in a package.

Furthermore, various embodiments may allow for a multi-chip connection with increased reliability, for example due a decreased number of connecting contacts.

Furthermore, various embodiments may allow for a multi-chip connection with improved electrical performance.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die arrangement, comprising:
a carrier having a first side and a second side opposite the first side, the carrier comprising an opening leading from the first side of the carrier to the second side of the carrier;
a first die disposed over the first side of the carrier and electrically contacting the carrier;
a second die disposed over the second side of the carrier and electrically contacting the carrier;
an electrical contact structure leading through the opening in the carrier and electrically contacting the second die,
wherein the first die and the second die each have a first side and a second side opposite the first side and the first side is a front side and the second side is a back side of the respective die;
wherein the first die is disposed over the first side of the carrier such that the second side of the first die faces the first side of the carrier and wherein the second die is disposed over the second side of the carrier such that the first side of the second die faces the second side of the carrier;

wherein the first die comprises an electrical contact located on the second side of the first die and wherein the second die comprises a first electrical contact located on the first side of the second die and a second electrical contact located on the second side of the second die;

wherein the electrical contact of the first die and the first electrical contact of the second die are electrically connected with one another via the carrier and wherein the second electrical contact of the second die is electrically contacted by the electrical contact structure;

wherein the electrical contact of the first die is a source/drain contact of the first die and wherein the first electrical contact of the second die is a first source/drain contact of the second die, and wherein the second electrical contact of the second die is a second source/drain contact of the second die.

2. The die arrangement as claimed in claim 1, wherein the first side of the carrier is an upper side of the carrier and the second side of the carrier is a lower side of the carrier.

3. The die arrangement as claimed in claim 1, wherein the carrier comprises electrically conductive material.

4. The die arrangement as claimed in claim 1, wherein the carrier is configured as a lead frame.

5. The die arrangement as claimed in claim 1, wherein the electrical contact of the first die is a drain contact of the first die;
wherein the first electrical contact of the second die is a source contact of the second die; and
wherein the second electrical contact of the second die is a drain contact of the second die.

6. The die arrangement as claimed in claim 1, further comprising a second electrical contact structure;
wherein the second die comprises a third electrical contact located on the first side of the second die; and
wherein the third electrical contact of the second die is electrically contacted by the second electrical contact structure.

7. The die arrangement as claimed in claim 6,
wherein the carrier comprises a third region that is electrically insulated from a first region of the carrier that is electrically contacted by the electrical contact of the first die and the first electrical contact of the second die; and
wherein the second electrical contact structure electrically contacts the third electrical contact of the second die via the third region of the carrier.

8. The die arrangement as claimed in claim 7,
wherein the second electrical contact structure is disposed over the first side of the carrier in the third region of the carrier; and
wherein the second die is arranged such that the third electrical contact of the second die is disposed over the second side of the carrier in the third region of the carrier.

9. The die arrangement as claimed in claim 6,
wherein the carrier comprises a second opening leading from the first side of the carrier to the second side of the carrier; and
wherein the second electrical contact structure leads through the second opening in the carrier.

10. The die arrangement as claimed in claim 9, wherein the second die is arranged such that the third electrical contact is located at least partially below the second opening.

11. The die arrangement as claimed in claim 6, wherein the third electrical contact of the second die is a gate contact of the second die.

12. The die arrangement as claimed in claim 6, wherein at least one of the first die and the second die is configured as a power die.

13. The die arrangement as claimed in claim 12, further comprising a third die disposed over the first side of the carrier, wherein an electrical contact of the third die is electrically contacted by the second electrical contact structure.

14. The die arrangement as claimed in claim 13, wherein the third die is configured as a logic die.

15. A method of forming a die arrangement, the method comprising:
providing a carrier having a first side and a second side opposite the first side;
forming an opening in the carrier leading from the first side of the carrier to the second side of the carrier;
disposing a first die over the first side of the carrier, the first die electrically contacting the carrier;
disposing a second die over the second side of the carrier, the second die electrically contacting the carrier;
forming an electrical contact structure, the electrical contact structure leading through the opening in the carrier and electrically contacting the second die
wherein the first die and the second die each have a first side and a second side opposite the first side and the first side is a front side and the second side is a back side of the respective die;
wherein the first die is disposed over the first side of the carrier such that the second side of the first die faces the first side of the carrier and wherein the second die is disposed over the second side of the carrier such that the first side of the second die faces the second side of the carrier;
wherein the first die comprises an electrical contact located on the second side of the first die and wherein the second die comprises a first electrical contact located on the first side of the second die and a second electrical contact located on the second side of the second die;
wherein the electrical contact of the first die and the first electrical contact of the second die are electrically connected with one another via the carrier and wherein the second electrical contact of the second die is electrically contacted by the electrical contact structure;
wherein the electrical contact of the first die is a source/drain contact of the first die and wherein the first electrical contact of the second die is a first source/drain contact of the second die, and wherein the second electrical contact of the second die is a second source/drain contact of the second die.

* * * * *